United States Patent
Cheng et al.

(10) Patent No.: US 10,403,789 B2
(45) Date of Patent: Sep. 3, 2019

(54) LIGHT-EMITTING ELEMENT AND THE MANUFACTURING METHOD THEREOF

(71) Applicant: EPISTAR CORPORATION, Hsinchu (TW)

(72) Inventors: Ching-Tai Cheng, Hsinchu (TW); Ju-lien Kuo, Hsinchu (TW); Min-Hsun Hsieh, Hsinchu (TW); Shau-Yi Chen, Hsinchu (TW); Shih-An Liao, Hsinchu (TW); Jhih-Hao Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 225 days.

(21) Appl. No.: 15/424,271

(22) Filed: Feb. 3, 2017

(65) Prior Publication Data
US 2017/0331003 A1 Nov. 16, 2017

(30) Foreign Application Priority Data

Feb. 4, 2016 (TW) .............................. 105103796 A
Jan. 25, 2017 (TW) .............................. 106103062 A

(51) Int. Cl.
| | |
|---|---|
| H01L 33/00 | (2010.01) |
| H01L 21/00 | (2006.01) |
| H01L 33/22 | (2010.01) |
| H01L 33/50 | (2010.01) |
| H01L 51/52 | (2006.01) |
| H01L 27/15 | (2006.01) |
| H01L 33/44 | (2010.01) |

(52) U.S. Cl.
CPC ............ *H01L 33/22* (2013.01); *H01L 33/007* (2013.01); *H01L 33/505* (2013.01); *H01L 33/507* (2013.01); *H01L 51/5284* (2013.01); *H01L 27/153* (2013.01); *H01L 33/44* (2013.01); *H01L 2933/0041* (2013.01)

(58) Field of Classification Search
CPC ............................. H01L 33/22; H01L 33/44; H01L 33/50–508; H01L 51/5284; H01L 2933/0041
USPC ................ 257/98, 100, E33.061; 438/27, 29
See application file for complete search history.

(56) References Cited

U.S. PATENT DOCUMENTS

| | | | | |
|---|---|---|---|---|
| 2006/0113617 | A1* | 6/2006 | Kawamura | H01L 27/322 257/414 |
| 2011/0284822 | A1* | 11/2011 | Jung | H01L 33/505 257/13 |
| 2013/0187174 | A1* | 7/2013 | Tischler | H01L 27/14 257/80 |
| 2014/0362885 | A1* | 12/2014 | Sakuta | H01L 33/50 372/44.01 |
| 2015/0280081 | A1* | 10/2015 | Wada | H01L 33/505 438/27 |
| 2016/0099387 | A1* | 4/2016 | Tsutsui | H01L 33/62 257/98 |
| 2018/0358516 | A1* | 12/2018 | Pust | H01L 33/08 |

\* cited by examiner

*Primary Examiner* — Mohammed Shamsuzzaman
*Assistant Examiner* — Aaron J Gray
(74) *Attorney, Agent, or Firm* — Muncy, Geissler, Olds & Lowe, P.C.

(57) ABSTRACT

This disclosure discloses a light-emitting element having a light-emitting unit, a transparent layer and a wavelength conversion layer formed on the transparent layer. The transparent layer covers the light-emitting unit. The wavelength conversion layer includes a phosphor layer having a phosphor and a stress release layer without the phosphor.

8 Claims, 28 Drawing Sheets

LIGHT-EMITTING ELEMENT AND THE MANUFACTURING METHOD THEREOF

BACKGROUND

Technical Field

The present disclosure relates to a light-emitting element including a light-emitting diode. The light-emitting element further includes a phosphor layer and a stress release layer.

Reference to Related Application

This application claims the benefit of TW Application Serial No. 105103796, filed on Feb. 4, 2016, the content of which is hereby incorporated by reference in its entirety.

Description of the Related Art

The light-emitting diode is gradually replacing traditional light source in lamps because of various advantages, such as low power consumption, environmental protection, long operational life and small volume.

While applying the light-emitting diode or light-emitting element including a light-emitting diode to different cases, the intensity of light, reliability, direction of light, distribution of light field and uniformity of color in all directions are factors to be concerned.

Aforementioned light-emitting diodes or light-emitting elements can be further encapsulated or connected to other elements to form a light-emitting device. A light-emitting device can have a sub-mount having one circuit, one solder on the sub-mount to fix the light-emitting element on the sub-mount and to electrically connect the light-emitting element and the circuit on the sub-mount, and an electrical connection structure electrically connecting electrodes of the light-emitting element and the circuit on the sub-mount. The sub-mount can be a lead frame or a mounting substrate.

SUMMARY OF THE DISCLOSURE

This disclosure discloses a light-emitting element having a light-emitting unit, a transparent layer and a wavelength conversion layer formed on the transparent layer. The transparent layer covers the light-emitting unit. The wavelength conversion layer includes a phosphor layer having a phosphor and a stress release layer without the phosphor.

This disclosure discloses a light-emitting element having a light-emitting unit configured to emit a first light with a first peak wavelength, a wavelength conversion layer configured to emit a second light with a second peak wavelength greater than the first peak wavelength and an insulating layer. The light-emitting unit has a top surface, a bottom surface, and a first side surface and a second side surface arranged between the top surface and the bottom surface. The insulating layer has a first absorption rate to the first light, and a second absorption rate to the second light. The insulating layer surrounds the first side surface, the second side surface and the wavelength conversion layer. Wherein the first absorption rate is greater than second absorption rate.

This disclosure discloses a light-emitting element having a light-emitting unit, a wavelength conversion layer and an insulating layer. The light-emitting unit has a top surface, a bottom surface, a first side surface and a second side surface arranged between the top surface and the bottom surface, and a first width between the first side surface and the second side surface. The wavelength conversion layer covers the top surface and has a second width. The insulating layer surrounds the first side surface, the second side surface and the wavelength conversion layer. Wherein the second width is substantially equal to or greater than the first width ranged from 1 μm to 50 μm.

BRIEF DESCRIPTION OF THE DRAWING

The accompanying drawings are included to provide easy understanding of the application, and are incorporated herein and constitute a part of this specification. The drawings illustrate the embodiments of the application and, together with the description, serve to illustrate the principles of the application.

FIGS. 9A-9C and 9G-9I show a manufacturing process of a light-emitting element shown in FIG. 7D.

FIGS. 10A-10D and 10G-10H show a manufacturing process of a light-emitting element in FIG. 7F.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure accompanied with the drawings.

Figure 1:
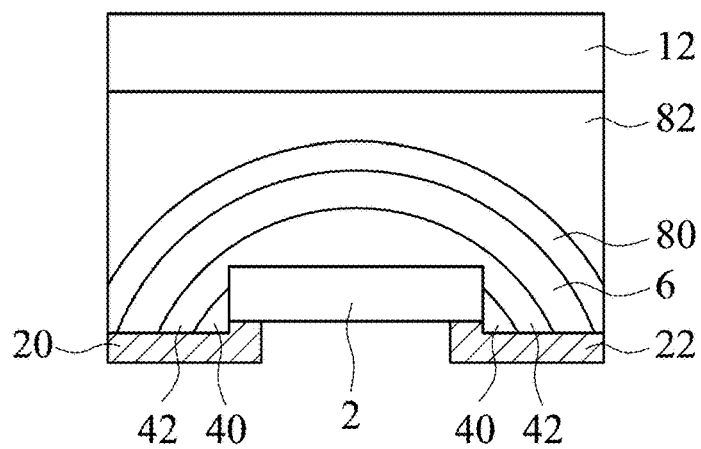
FIG. 1 shows a schematic view of a light-emitting element in accordance with one embodiment of the present disclosure.

FIG. 1 shows a schematic view of a light-emitting element in accordance with one embodiment of the present disclosure. The light-emitting element 1000 has a light-emitting unit 2, conduction layers 20 and 22, a first transparent bottom layer 40, a second transparent bottom layer 42, a wavelength conversion layer 6, a first transparent top layer 80, a second transparent top layer 82 and a carrier 12. The conduction layers 20, 22 can be used for electrical connection between the light-emitting element and external circuit. For example, the light-emitting element 1000 can be mounted to a carrier through the conduction layers 20, 22. The light-emitting unit 2 has one side connected to the conduction layers 20, 22, and the light-emitting unit 2 is electrically connected to external circuit. As the cross-sectional view shown in FIG. 1, the first transparent bottom layer 40 locates on two sides of the light-emitting unit 2 and connects to the conduction layers 20, 22. The first transparent bottom layer 40 surrounds the four sides of the light-emitting unit 2 in a top view. The second transparent bottom layer 42 is formed on the first transparent bottom layer 40. The distance between the second transparent bottom layer 42 and the wavelength conversion layer 6 is less than that between the first transparent bottom layer 40 and the wavelength conversion layer 6. The second transparent bottom layer 42 also covers the sidewall of the light-emitting unit 2. The first transparent bottom layer 40 and the second transparent bottom layer 42 can have same or different materials. The first transparent bottom layer 40 or the second transparent bottom layer 42 has a transparency to the light from the light-emitting unit 2, for example, more than 60% of the light can pass the first transparent bottom layer 40 or the second transparent bottom layer 42. There is at least one difference in physic characteristic between the first transparent bottom layer 40 and the second transparent bottom layer 42, for example, hardness or density. The second transparent bottom layer 42 directly connects to not only the wavelength conversion layer 6, the light-emitting unit 2 and the first transparent bottom layer 40, but also the portions of the conduction layers 20, 22 not being covered by the light-emitting unit 2 or the first transparent bottom layer 40.

In another embodiment, the conduction layers 20, 22 extend away from the light-emitting unit 2 in a lateral direction. The portion of the conduction layers 20, 22 not overlapped with the light-emitting unit 2 is covered by the first transparent bottom layer 40, the second transparent bottom layer 42 and/or the wavelength conversion layer 6. Therefore, the conduction layers 20, 22 are not directly connected to the first transparent top layer 80 or the second transparent top layer 82. In another embodiment, an insulating layer is formed between the first transparent bottom layer 40 and the conduction layers 20, 22; between the second transparent bottom layer 42 and the conduction layers 20, 22; between the conduction layers 20, 22 and the bottom surface of the light-emitting unit 2 (not shown in the figure). In addition, the conduction layers 20, 22 extend in a direction to decrease distance between the conduction layers 20, 22 and the conduction layers 20, 22 also cover part of the bottom surface (not shown in the figure) of the light-emitting unit 2 which is among the conduction layers 20, 22. In addition, the light can be concentrated on the side where the wavelength conversion layer locates while the insulating layer can reflect and/or scatter the light emitting from the light-emitting unit 2 to the conduction layers 20, 22.

The material of the transparent bottom layers 40, 42 and the transparent top layers 80, 82 can be thermosetting resin, such as epoxy resin, silicone resin, phenol resin, unsaturated polyester resin or polyimide resin. In another embodiment, the material of the transparent bottom layers 40, 42 and the transparent top layers 80, 82 is silicone resin. In an embodiment, the material of the transparent bottom layers 40, 42 and the transparent top layers 80, 82 is B-stage silicone resin or the C-stage silicone resin completely cured by heating, wherein the B-stage silicone resin is a semi-curable resin between uncured A-stage silicone resin and fully cured C-stage silicone resin. In an embodiment, the transparent bottom layers 40, 42 and the transparent top layers 80, 82 include silicone resin having aliphatic compounds, such as Polymethylhydrosiloxane compound, which have better ductility and malleability that can resist the heat stress generated from the light-emitting element 1000 without degradation. In another embodiment, the transparent bottom layers 40, 42 and the transparent top layers 80, 82 include silicone resin having aromatic compounds, such as Polyphenylmethylsiloxane compound, which have larger refractive index to increase the light extraction efficiency of the light-emitting element 1000.

The light-emitting unit 2 can include an active layer sandwiched between two semiconductor layers. The two semiconductor layers are first type semiconductor layer, such as an n-type semiconductor layer, and second type semiconductor layer, such as a p-type semiconductor layer. The conductive types of the first type and second type semiconductor layers are different, and the first type and second type semiconductor layers provide electrons and holes. Each of the first type and second type semiconductor layers has an energy bandgap larger than that of the active layer to increase the possibility of combination of electrons and holes within the active layer and the possibility of light emission. The material of the active layer and the first type and the second type semiconductor layers can include semiconductor material of III-V group, such as $Al_xIn_yGa_{(1-x-y)}N$ or $Al_xIn_yGa_{(1-x-y)}P$, wherein the $0 \leq x$, $y \leq 1$ and $(x+y) \leq 1$. The light-emitting unit 2 can emit a red light having a peak wavelength or a dominant wavelength between 610~650 nm, a green light having a peak wavelength or a dominant wavelength between 530~570 nm, a blue light having a peak wavelength or a dominant wavelength between 450~490 nm, a purple light having a peak wavelength or a dominant wavelength between 400~440 nm or an ultraviolet light having a peak wavelength between 200~400 nm. In addition, a light-emitting unit 2 can include a supporting substrate to support a light-emitting layer. In an embodiment, the supporting substrate is a substrate for epitaxial growth. The substrate can be made of material(s), for example, sapphire, gallium nitride, silicon, silicon nitride, etc., which are suitable for forming (e.g., epitaxial growth technique) a semiconductor material, such as III-V group compound and II-VI group compound, that can be used to form a light-emitting layer. In another embodiment, the supporting substrate is not a material layer or a growth substrate for directly forming the active layer thereon. The supporting substrate can be used as a supporting member for substituting or supporting the growth substrate. The supporting member can be selected from a structure having material(s), structure(s), or shape(s) different from that of the growth substrate.

The conduction layers 20, 22 include metal material, such as titanium, nickel, gold, platinum or aluminum. In one embodiment, the conduction layer is a multi-layer structure including a stack of titanium/aluminum/nickel/aluminum/nickel/aluminum/nickel/gold, or a stack of titanium/aluminum/titanium/aluminum/nickel/aluminum/nickel/gold, wherein the lowermost layer is gold for direct contact with the a metal bump.

The wavelength conversion layer 6 covers the first transparent bottom layers 40 or the second transparent bottom layer 42 and includes one or more wavelength conversion material and a base material having a refractive index (n) between 1.4~1.6 or between 1.5~1.6. In one embodiment, as shown in FIG. 1, the wavelength conversion layer 6 covers a surface of the light-emitting unit 2 close to the carrier 12 and two sides of the light-emitting unit 2 from the cross-sectional view. The wavelength conversion layer 6 covers the light-emitting unit 2 entirely and surrounds the light-emitting unit 2 from the top view. Furthermore, the wavelength conversion layer 6 directly contacts the conduction layers 20, 22. In another embodiment, the wavelength conversion layer 6 covers a surface of the light-emitting unit 2 close to the carrier 12 but does not cover the two sides of the light-emitting unit 2 or does not entirely cover the two sides of the light-emitting unit 2 while the wavelength conversion layer 6 is not directly connected to the conduction layers 20, 22 (not shown in the figure). The "cover" disclosed herein including a structure of two objects overlapped and directly contacted with each other or a structure of two objects overlapped with each other in one direction but not contacted with each other. The wavelength conversion layer 6 is covered by a first transparent top layer 80 and a second transparent top layer 82. The transparent top layers 80, 82 have a transparency to the light from the light-emitting element 2, for example, more than 60% of the light can pass the transparent top layers 80, 82. In an embodiment, at least a part of the edge of the first transparent top layer 80, at least a part of the edge of the second transparent top layer 80 and the edge of the carrier 12 are located on the same surface (in a 2-D dimension), and the first transparent top layer 80 is contacted with one side of the conduction layers 20, 22 which is close to the light-emitting unit 2. The materials of the transparent top layers 80, 82 can be the same or different.

There is at least one difference in physic characteristic between the transparent top layers 80, 82, such as hardness or intensity. In an embodiment, the transparent bottom layers 40, 42, the wavelength conversion layer 6, and the transparent top layers 80, 82 have a transparency to the light from the light-emitting unit 2, for example, more than 60% of the light can pass the layers. The layers can include same or different materials. In addition, scattering particles, such as titanium dioxide or silicon dioxide, can be added into the layers to change the direction of light, to average the light-intensity in the light field, or to lower the glare. In another embodiment, pigments can be added into the layers to change the color of the light-emitting element 1000 to derive different visual effects. In an embodiment, a material having a color different from the wavelength conversion layer 6 is added into the transparent top layers 80, 82 or the carrier to change the color of the contour of the light-emitting element. For example, a white material is added into the second transparent top layer 82 to render the light-emitting element 1000 to have a white appearance when not emitting light.

The wavelength conversion material absorbs a first light from the light-emitting unit 2 and emits a second light having a peak wavelength or a dominant wavelength different from that of the first light. The wavelength conversion material includes quantum dot material, yellow-green phosphor, red phosphor or blue phosphor. The yellow-green phosphor includes YAG, TAG, silicate, vanadate, alkaline earth metal selenide, or metal nitride. The red phosphor includes fluoride (e.g., K2TiF6: Mn4+ or K2SiF6: Mn4+), silicates, vanadates, alkaline earth metal sulfides, metal oxynitrides, or a mixture of tungstates and molybdates. The blue phosphor includes $BaMgAl_{10}O_{17}$: $Eu^{2+}$. In one embodiment, the first light and the second light are mixed to form a white light. The white light has a color coordinate (x, y) on the CIE 1931 x-y chromaticity space, wherein the x is between 0.27~0.285, and y is between 0.23~0.26. In an embodiment, the white light has a color temperature between 2200~6500 K, such as 200 K, 2400 K, 2700 K, 3000 K, 5700 K or 6500 K and has a color coordinate (x, y) within a seven step MacAdam ellipse in the CIE 1931 x-y chromaticity space. In an embodiment, the first light and the second light are mixed to form a non-white light, such as a purple light or a yellow light, wherein the first light is almost converted to the second light. In an embodiment, the thickness of the wavelength conversion layer 6 is between 100~350 μm. When the thickness is less than 100 μm, the wavelength conversion layer may not be strong enough to support the light-emitting element 1000. When the thickness is larger than 350 μm, the light-emitting element 1000 is too thick to be adopted in applications requiring compact size, such as watches, belts, clothes, glasses, or other wearable devices.

A carrier 12 is formed on a side of the second transparent top layers 82 away from the light-emitting unit 2. In an embodiment, the carrier has a transparency to the light from the light-emitting unit 2, for example, more than 60% of the light can pass the carrier 12. Scattering particles can be added in to the carrier 12 to average the light intensity within a light field or improve the light extraction efficiency. In an embodiment, as shown in FIG. 1, the carrier has a rectangular shape or similar appearance. The carrier can also have a trapezoidal or inverted trapezoidal shape. In another embodiment, an optical layer can be formed on a side of the second transparent top layers 82 away from the light-emitting unit 2 by molding, spraying, dispensing, and so on to influence the moving direction of light. For example, the light from the light-emitting unit 2 to the carrier 12 is directed to the sidewall of the light-emitting element 1000 or directed to the conduction layers 20, 22. Besides, the surface of the carrier 12 can be flat or non-planar for different type of light field. For example, a distribution of color temperature or light intensity of a carrier 12 having a roughed (non-planar) surface is more uniform than that of a carrier 12 having a flat surface. Referring to FIG. 1, the side wall of the light-emitting element 1000, including the surface from the carrier 12 through the transparent top layers 80, 82 and the wavelength conversion layer 6 to the conduction layers 20, 22, is a continuous surface without protrusion. In another embodiment, the sidewall can include a convex and concave surface. For example, the transparent top layers 80, 82 or the wavelength conversion layer 6 is/are protruded or recessed compared with the carrier 12 and the conduction layers 20, 22. Furthermore, the sidewall of the light-emitting element 1000 can have one or more types of distribution of roughness.

Figure 2:
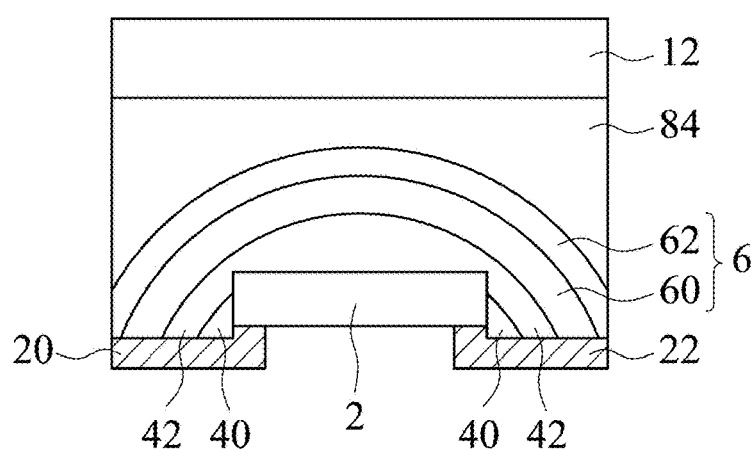
FIG. 2 shows a schematic view of a light-emitting element in accordance with one embodiment of the present disclosure.

Referring to FIG. 2, the light-emitting element 2000 includes a light-emitting unit 2, conduction layers 20, 22, transparent bottom layers 40, 42, a wavelength conversion layer 6, a transparent top layer 84 and a carrier 12. The same or similar structures and characteristics between the light-emitting element 1000 and the light-emitting element 2000 are not repeated for brevity. In this embodiment, the wavelength conversion layer 6 includes a first wavelength conversion layer 60 and a second wavelength conversion layer 62. The two layers include different material, for example, the first wavelength conversion layer 60 includes a wavelength conversion material which is not included in the second wavelength conversion layer 62. The wavelength conversion layer 6 covers the light-emitting element 2 and extends to right and left directions to be coplanar with the upper structure or lower structure. The first wavelength conversion layer 60 has a contour substantially the same with that of the second wavelength conversion layer 62. In this embodiment, the wavelength conversion layer 6 is a sheet which can be bent to be attached to the lower structure. The wavelength conversion layer 6 has a thickness, such as 200 μm, which is close to the thickness of the light-emitting unit 2 (which is between 100 μm and 200 μm, such as 150 μm or 170 μm) and thinner than the thickness of the carrier 12 (which is between 200 μm and 600 μm, such as 250 μm, 300 μm or 500 μm). In another embodiment, the thickness of the wavelength conversion layer 6 can be thicker than that of the carrier 12 (which is between 100 μm and 200 μm, such as 110 μm, 130 μm or 170 μm). The transparent bottom layers 40, 42 cover the sidewall and top surface of the light-emitting unit 2 while its contour and thickness can be modified to match with the flexibility of the wavelength conversion layer 6 so the combination strength between the transparent bottom layers 40, 42 and the wavelength conversion layer 6 can be enhanced. The transparent top layers 80, 82, 84 have a transparency to the light from the light-emitting unit 2, for example, more than 80% of the light can pass the transparent top layers 80, 82, 84. In an embodiment, the transparent top layer 84 and the second wavelength conversion layer 62 have the same material, such as silicone, and one physical characteristic being different from the transparent top layer 84 and the second wavelength conversion layer 62. For example, the hardness of the transparent top layer 84 is larger than that of the second wavelength conversion layer 62 or the refractive index of the transparent top layer 84 is smaller than that of the second wavelength conversion layer 62. As shown in FIGS. 1~2, the wavelength conversion layer 6 is not directly contacted with the light-emitting unit 2, but the wavelength conversion layer 6 can be arranged to be directly contacted with the surface and/or the corner of the light-emitting unit 2 in another embodiment.

Figure 3A:
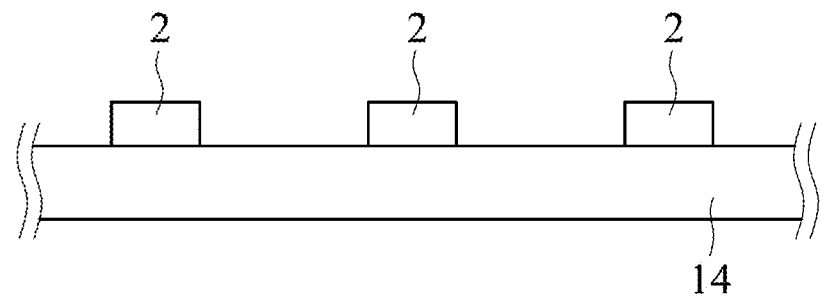
FIGS. 3A, 3B, 3C, 3D, 3E, and 3F show a manufacturing process of a light-emitting element in accordance with one embodiment of the present disclosure.
Figure 3B:
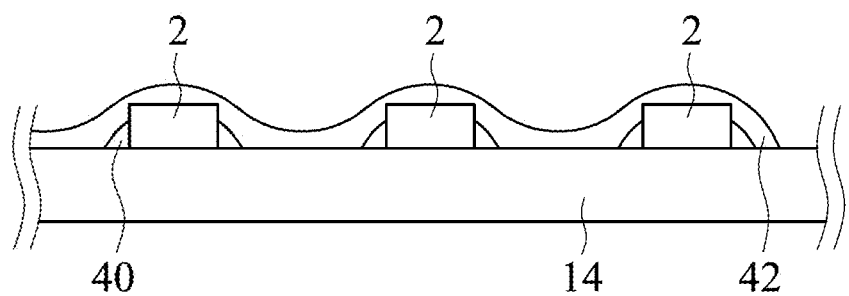

FIGS. 3A~3F and FIGS. 3C'~3F' show a manufacturing process of a light-emitting element in accordance with one embodiment of the present disclosure. As shown in FIGS. 3A~3B, multiple light-emitting units 2 are arranged on a temporary carrier 14. These multiple light-emitting units 2 can be sorted before arranging on the temporary carrier 14 and have similar opto-electronic characteristics, such as threshold voltage, power, light-emitting efficiency, color temperature and light intensity. Or, these multiple light-emitting units 2 are products from a wafer, and the units are not sorted. The transparent layer may not be continuous on some regions while sequentially covering the first transparent bottom layer 40 and the second transparent bottom layer 42 on the temporary carrier 14. For example, the second transparent bottom layer 42 does not cover or merely cover the region which is overlapped by the temporary carrier 14 and the light-emitting unit 2. In addition, the second transparent bottom layer 42 on the temporary carrier 14 has ups and downs related to the position where the light-emitting unit 2 locates because the second transparent bottom layer 42 is a soft material.

Figure 3C:
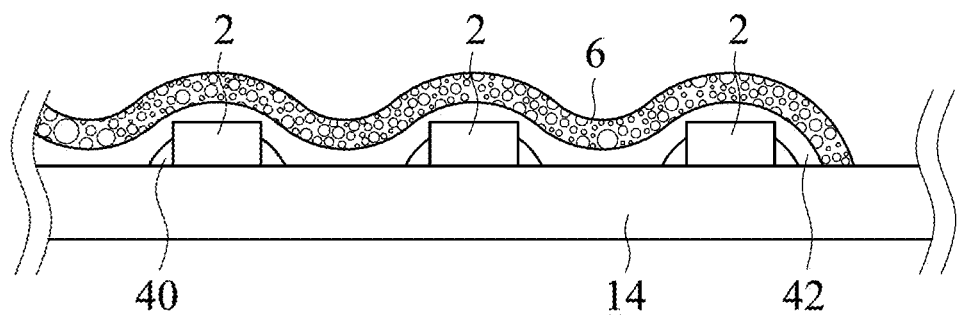
Figure 3C:
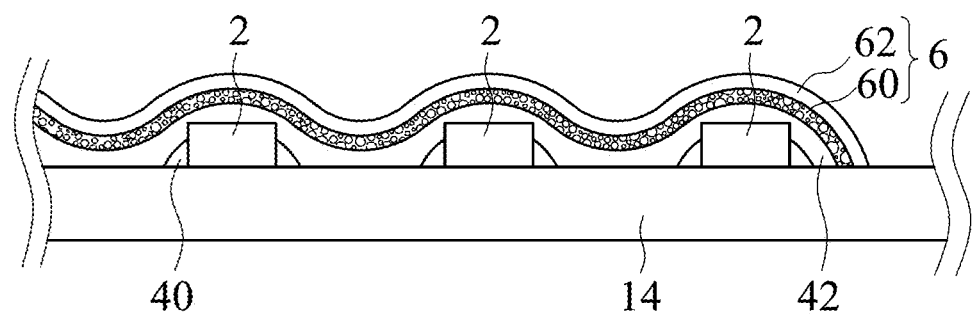

Referring to FIG. 3C, the wavelength conversion layer 6 can be formed on the second transparent bottom layer 42 through spraying or painting. The wavelength conversion layer 6 can include one or more wavelength conversion materials, and the particle sizes of the wavelength conversion materials can be the same, different or within a range. In addition to the wavelength conversion material, the particles of scattering material, such as titanium dioxide can be added into the wavelength conversion layer 6.

Figure 3D:
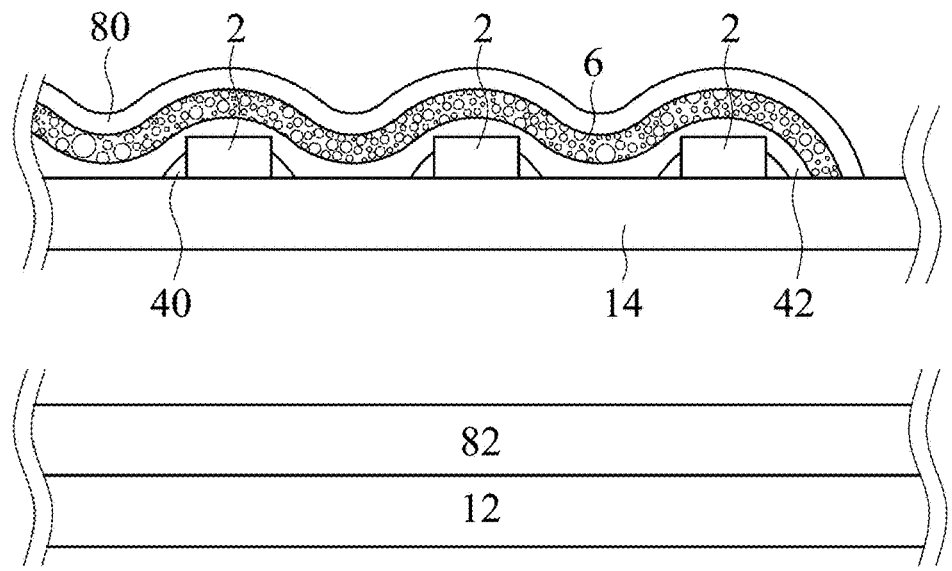
Figure 3D:
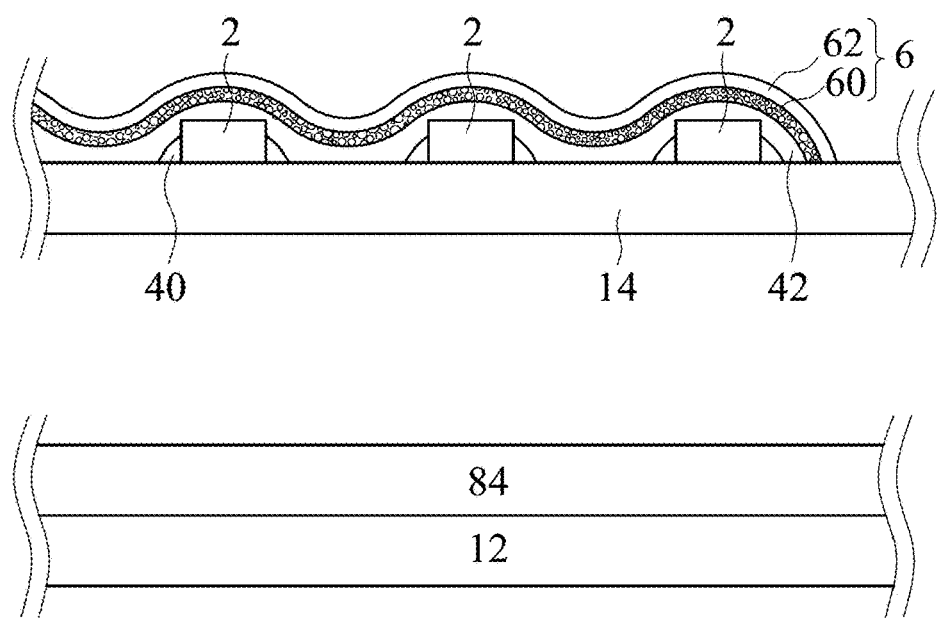
Figure 3E:
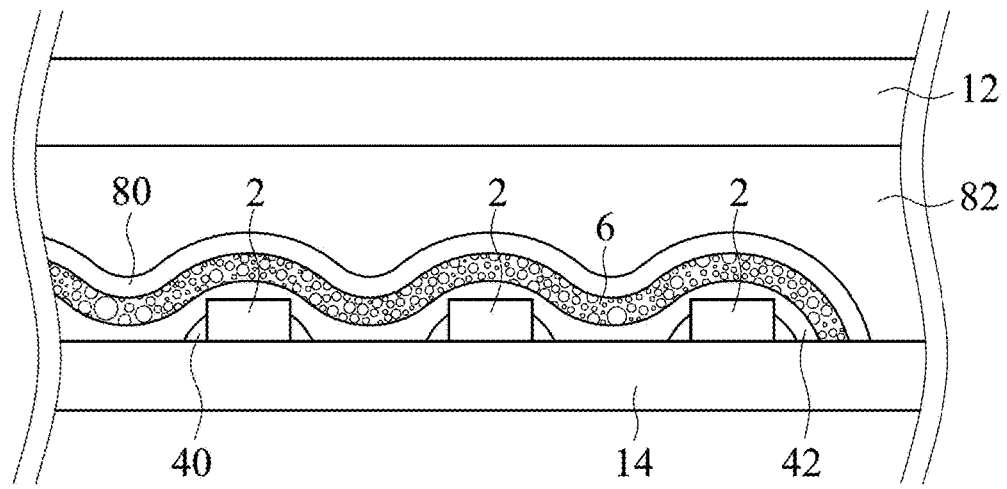
Figure 3E:
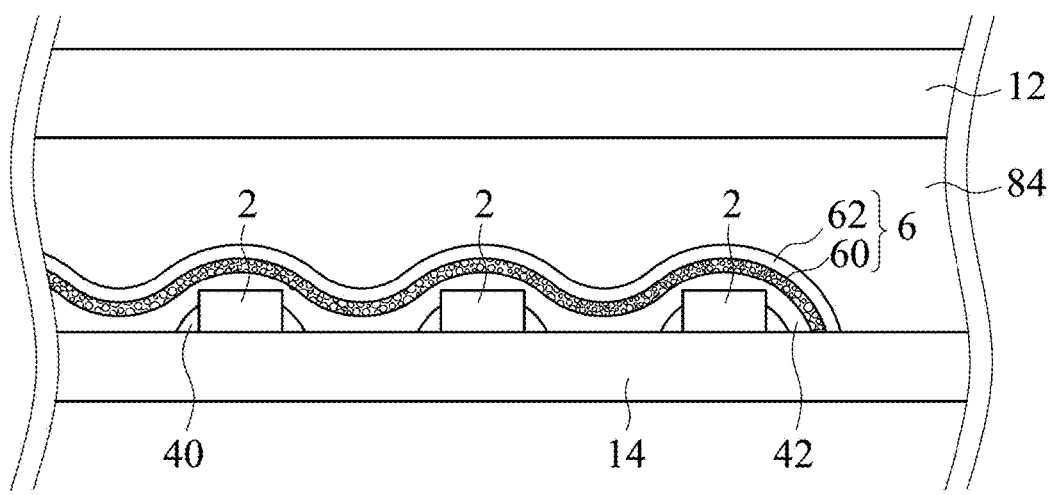
Figure 3F:
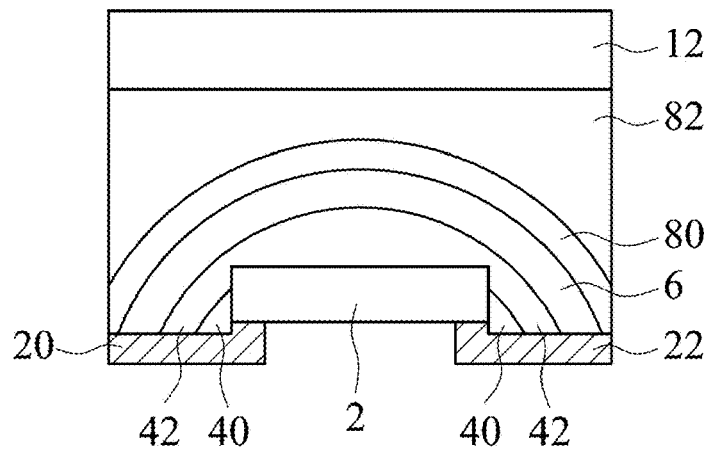
Figure 3F:
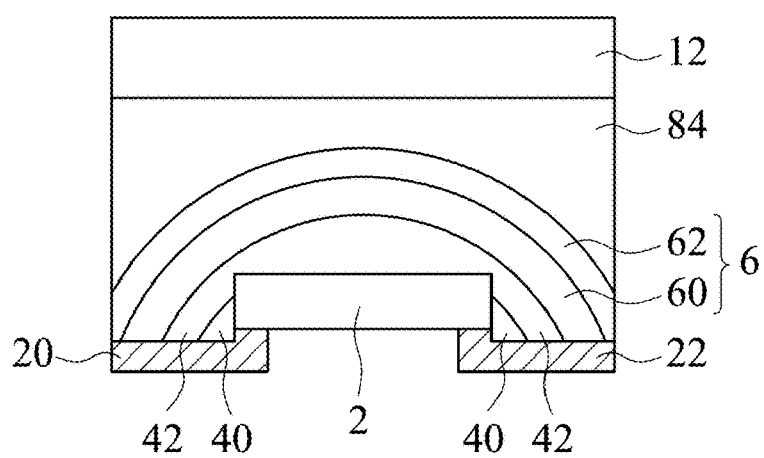

Referring to FIG. 3D, a first transparent top layer 80 is formed to cover the wavelength conversion layer 6. In addition, a carrier 12 and a second transparent top layer 82 covering one side of the carrier 12 are provided. The first transparent top layer 80 and the second transparent top layer 82 can include the same material having a transparency to the light from the light-emitting unit 2, for example, more than 80% of the light from the light-emitting unit 2 can pass the transparent top layers 80, 82. The second transparent top layer 82 is then formed on the carrier 12 as shown in FIG. 3E. The carrier 12 and the second transparent top layer 82 are heated and the second transparent top layer 82 is cured. The first transparent top layer 80 on the wavelength conversion layer 6 is not cured. When connecting the carrier 12 to the first transparent top layer 80 through the second transparent top layer 82, the first transparent top layer 80 is softer than the second transparent top layer 82 and the stress, such as the pressure from the carrier 12 to the first transparent top layer 80, is released. The recess portion of the second transparent top layer 82 can be filled with the first transparent top layer 80 to increase the strength of combination between the first transparent top layer 80 and the second transparent top layer 82. Then, the temporary carrier 14 is removed, and a conduction layer (not shown in the figure) is formed. After a dicing step (not shown in the figure), the structure as shown in FIG. 3F is completed. Referring to FIG. 3F, one light-emitting element 1000 has only one carrier 12 and a light-emitting unit 2. Nevertheless, one light-emitting element 1000 can include one carrier 12 and several light-emitting units 2, wherein these light-emitting units 2 can emit lights with identical colors, lights with different colors, or can emit invisible lights.

In the embodiment shown in FIGS. 3A~3F, the light-emitting unit 2 can be attached to the temporary carrier 14 through a styrofoam. The temporary carrier 14 can be a solid material, such as sapphire or glass. In another embodiment, a growth substrate for epitaxial growth can be replaced with the temporary carrier 14 during the aforementioned manufacturing process. As shown in FIG. 3D, the first transparent top layer 80 and the second transparent top layer 82 can be respectively formed on the wavelength conversion layer 6 and the carrier by spraying, printing, or dispensing.

The embodiment in FIGS. 3C'~3F' is similar with the embodiment in FIGS. 3A~3F while the similar manufacturing steps in FIGS. 3A~3B are omitted for brevity. As shown in FIG. 3C', the wavelength conversion layer 6 on the light-emitting unit 2 includes a first wavelength conversion layer 60 and a second wavelength conversion layer 62. The wavelength conversion layer 6 is formed on the light-emitting unit 2 by attaching. To be more specific, the wavelength conversion layer 6 is combined with the light-emitting unit 2 through the transparent bottom layer 42. The first wavelength conversion layer 60 and the second wavelength conversion layer 62 are combined to form the wavelength conversion layer 6, and the first wavelength conversion layer 60 includes more wavelength conversion material, such as phosphor, than the second wavelength conversion layer 62 does. For example, more than 80% of the wavelength conversion material particles locate within the first wavelength conversion layer 60. The result can be measured by a method, such as measuring the density of the wavelength conversion particles in a cross-sectional view through the electron micrograph to obtain the total number or total area of the wavelength conversion particles under a specific area, such as 100×100 micrometer square. Then the total number or total area of the first wavelength conversion layer 60 is compared with the second wavelength conversion layer 62 to derive the ratio above. Therefore, the light from the light-emitting unit 2 excites the wavelength conversion material in the first wavelength conversion layer 60 first and generates a converted light. The converted light and/or the light from the light-emitting unit 2 enter(s) the second wavelength conversion layer 62 to generate another converted light. The wavelength conversion layer 6 can be made of a soft material so the wavelength conversion layer 6 can be closely adhered to the contour of the light-emitting unit 2 and/or the transparent bottom layers 40, 42. So, the surface of the wavelength conversion layer 6 away from the light-emitting unit 2 is usually not a flat surface. As shown in FIG. 3D', a transparent top layer 84 is formed on a side of the carrier 12 and is baked to be cured. Then, as shown in FIG. 3E', a stack of the carrier 12 and the transparent top layer 84 is combined with the wavelength conversion layer 6. In another embodiment, a part or all region of the wavelength conversion layer 6 can be covered, sprayed, or dispensed by an adhesive layer (not shown in the figure), such as silicone, to increase the combination strength between the wavelength conversion layer 6 and the transparent top layer 84 before combining the carrier 12 and the transparent top layer 84.

The structure shown in FIG. 3F' is formed after removing the temporary carrier 14 and forming the conduction layers 20, 22. Similarly, the structure in FIG. 3F' can include one carrier 12 covering several light-emitting units 2, wherein these light-emitting units 2 can emit lights with identical colors, lights with different colors, or emit invisible light.

In the embodiment shown in FIGS. 3C'~3F', the wavelength conversion layer 6 is a preformed double-layered structure. As shown in FIG. 3C', the transparent bottom layers 40, 42 and the plurality of light-emitting units form a substantially smooth and continuous arc. The curvature of the continuous arc is matched with the flexibility of the wavelength conversion layer 6 to avoid of being excessively bent and fractured, or to avoid of forming a gap between the transparent bottom layer 40 and the wavelength conversion layer 6, which might trap the light in the gap and lower the light extraction efficiency. The wavelength conversion layer 6 and the transparent bottom layer 40 are combined closely with each other. The thickness of the bent wavelength conversion layer 6 may vary in all or some regions. That is, the thickness of all regions or some regions of the wavelength conversion layer 6 is decreased, or the thickness of one region is thinner than that of the other region. For example, the thickness of the region of the wavelength conversion layer 6 overlapped with the light-emitting unit 2 is thinner than the region of the wavelength conversion layer 6 not overlapped with the light-emitting unit 2. The difference of thickness can be 10% of the largest thickness of the region of the wavelength conversion layer 6 overlapped with the light-emitting unit 2. The thickness of the sidewall of the wavelength conversion layer 6 on the light-emitting unit 2 is thinner than the thickness of the wavelength conversion layer 6 above the light-emitting unit 2. The difference of thickness can be 10% of the largest thickness of the region of the wavelength conversion layer 6 above the light-emitting unit 2. In another embodiment, the transparent bottom layer 40 is not closely integrated with the wavelength conversion layer 6 and left a gap formed there between. The second wavelength conversion layer 62 of the wavelength conversion layer 6 is substantially devoid of the wavelength conversion material, and contacts the cured transparent top layer 84. The second wavelength conversion layer 62 includes a soft material, and the second wavelength conversion layer 62 can be used as a stress release layer to sustain more stress during manufacturing process. In that case, the wavelength conversion layer 6 is prevented from being damaged by the pressing from the carrier 12. The second wavelength conversion layer 62 can include scattering particles to change distribution of light field.

During the manufacturing process mentioned above, the second transparent bottom layer 42 is formed in a continuous arc contour and covers the temporary carrier 14, the first transparent bottom layer 40, and the light-emitting unit 2. In another embodiment, the second transparent bottom layer 42 mainly covers the first transparent bottom layer 40 and the light-emitting unit 2. Several discontinuous portions of second transparent bottom layer 42 may be unintentionally formed on some regions of the temporary carrier 14 which are not covered by the light-emitting unit 2 or the first transparent bottom layer 40 due to manufacturing flaws. The thicknesses of these discontinuous portions of second transparent bottom layer 42 are about the same as or different from each other. Bubble(s) may be included in the second transparent bottom layer 42. Because the first transparent bottom layer 40 and/or the second transparent bottom layer 42 does not continuously and completely cover the top surface of the temporary carrier 14, at least a part of the top surface of the carrier 14 is exposed and is not covered by the light-emitting unit 2, the first transparent bottom layer 40 or the second transparent bottom layer 42. Furthermore, an adhesive layer can be formed between the temporary carrier 14 and the light-emitting unit 2. The viscosity of the adhesive layer can be reduced by heating, pressing, etc., so the temporary carrier 14 and the light-emitting unit 2 can be separated. Then, the temporary carrier 14 can be recycled after separating the temporary carrier 14 and the light-emitting unit 2. The material of the temporary carrier 14 can be a solid material, such as glass or sapphire.

Figure 4A:
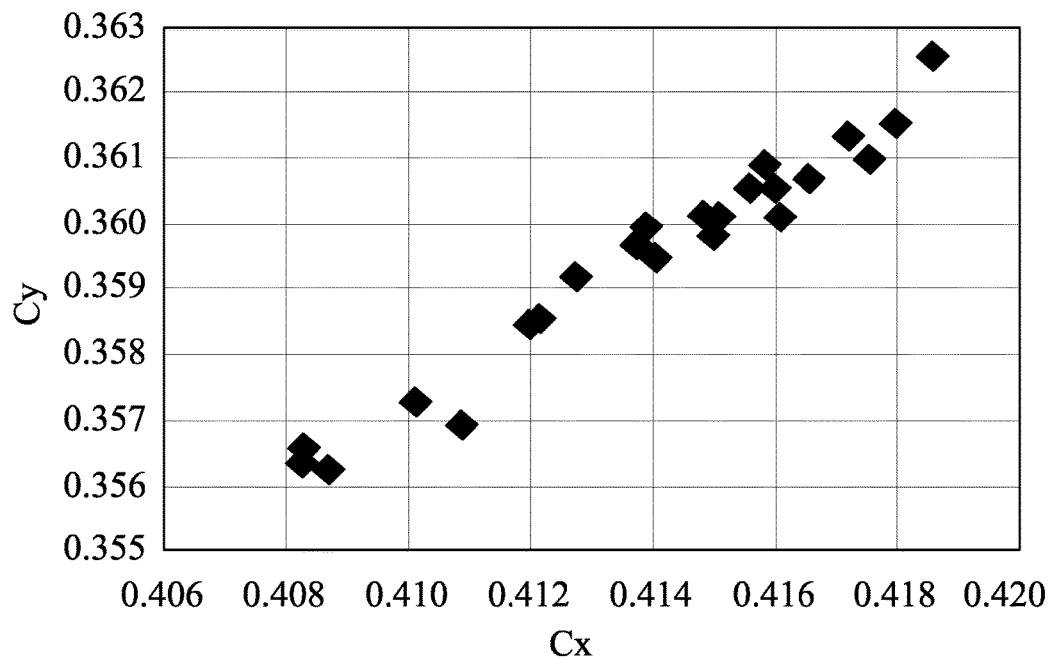
FIGS. 4A-4B show schematic views of optical properties of a light-emitting element in accordance with one embodiment of the present disclosure.

In the aforementioned embodiments, the phosphor can be applied to by the covering method as shown in FIGS. 3C~3F, or a wavelength conversion layer 6, which is preformed into a sheet-like formation, can be applied to by the method as shown in FIGS. 3C'~3F'. If the phosphor is applied to in the form of powder by spraying or painting, such as the method shown in the FIGS. 3C~3F, the ratio and the recipe of the phosphor applied are fixed after several adjustments. Then, the phosphor (of fixed ratio and recipe) is used to cover the light-emitting units 2. While the wavelength conversion layer 6 formed in advance as shown in FIGS. 3C'~3F' is applied, optical test can be applied to the wavelength conversion layer 6 before applying the wavelength conversion layer 6 in the process above. For example, several measuring points are selected from the entire sheet of the wavelength conversion layer 6 before cutting, and light sources are respectively arranged under the measuring points. Then, the lights emitted from the light sources and passing through sheet of the wavelength conversion layer 6 are measured to derive color coordinates respectively corresponding to the light sources (or the measuring points). For example, the result of measuring is shown in FIG. 4A. As shown in FIG. 4A, the color coordinates corresponding to the measuring points are restricted in a range, for example, the color coordinate Cx is between 0.408~0.42 and the color coordinate Cy is between 0.356~0.363.

Figure 4B:
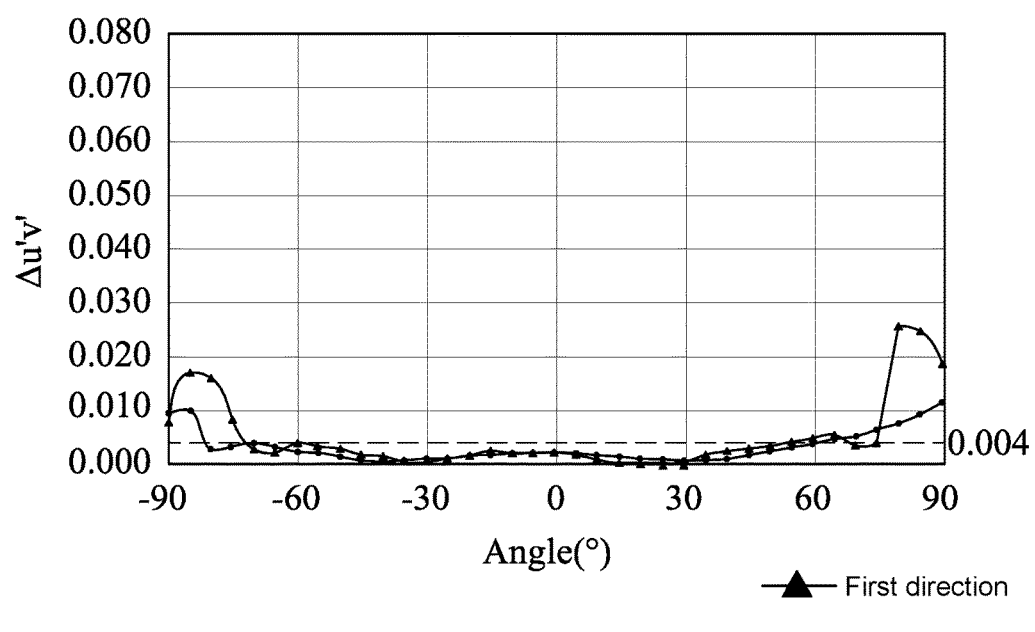

The characteristic of the wavelength conversion layer 6 can be derived from the distribution of the color coordinates shown in FIG. 4A. Moreover, the optical property of the wavelength conversion layer 6 combined with the light-emitting unit 2 is an important characteristic to evaluate the wavelength conversion layer 6. Referring to FIG. 4B, the X axis is the view angle, wherein the 0° on the axis is corresponding to the direction being vertical to the light-emitting unit 2. The +90° and the −90° are two opposite directions parallel to the top surface of the light-emitting unit 2. The difference of color coordinate $\Delta u'v'$ on the Y axis indicates the distance between a point and a reference point (u0', v0'). In other words, the larger difference of color coordinate $\Delta u'v'$ indicates a larger distance between a measuring point and the reference point (u0', v0'). It also indicates the ratio of mixing the first light and the second light of the measuring point is much different from that of other measuring points. To be more specific, $\Delta u'v' = (\Delta u'^2 + \Delta v'^2)^{1/2}$, $\Delta u' = u' - u0'$, and $\Delta v' = v' - v0'$, wherein the u' and v' are color coordinates of the CIE1976 chromaticity diagram, and the u0' and v0' are the average value of the color coordinates of the light in all directions. The smaller variation of the difference of color coordinate $\Delta u'v'$ is, the better uniformity of the color distribution in all viewing angles is.

The optical characteristic shown in FIG. 4B is derived by measuring the light-emitting element shown in FIGS. 2 and 3F' in a first direction entering the paper and a second direction parallel to the paper. The difference of color coordinate $\Delta u'v'$ based on the reference point on 0° within a range between +90° and −90° in the first direction is between 0~0.003, and the average of the difference of color coordinate $\Delta u'v'$ in all angles is lower than 0.004. The difference of color coordinate $\Delta u'v'$ based on the reference point on 0° within a range between +90° and −90° in the second direction is between 0~0.001, and the average of the difference of color coordinate $\Delta u'v'$ in all angles is lower than 0.004. According to the result, the difference of color coordinate $\Delta u'v'$ in the first direction is substantially the same with that in the second direction (0~0.03 in the first direction and 0~0.01 in the second direction), and the average values measured in the two directions are smaller than 0.01.

Figure 5A:
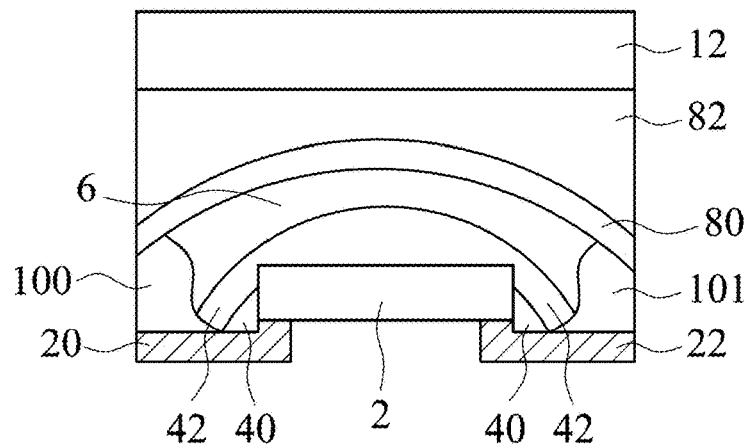
FIGS. 5A-5D show schematic views of light-emitting elements in accordance with embodiments of the present disclosure.
Figure 5B:
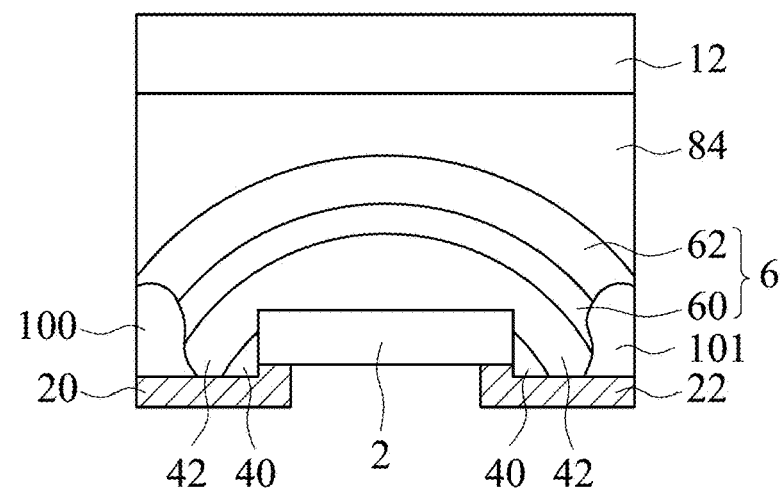
Figure 5C:
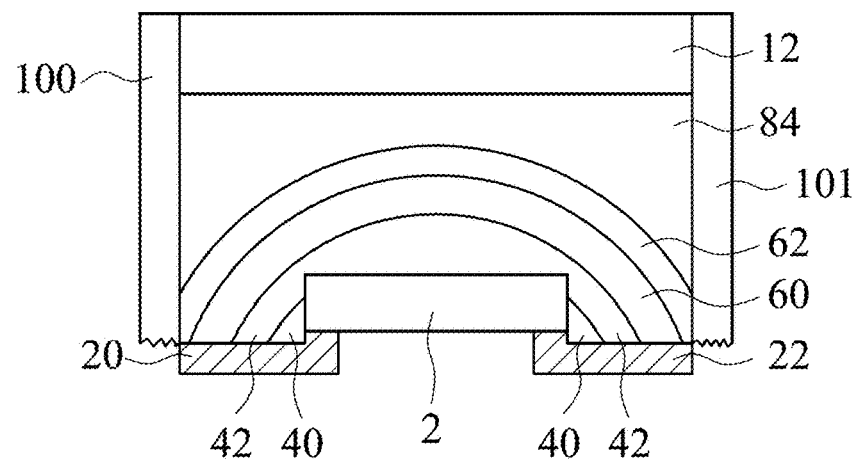
Figure 5D:
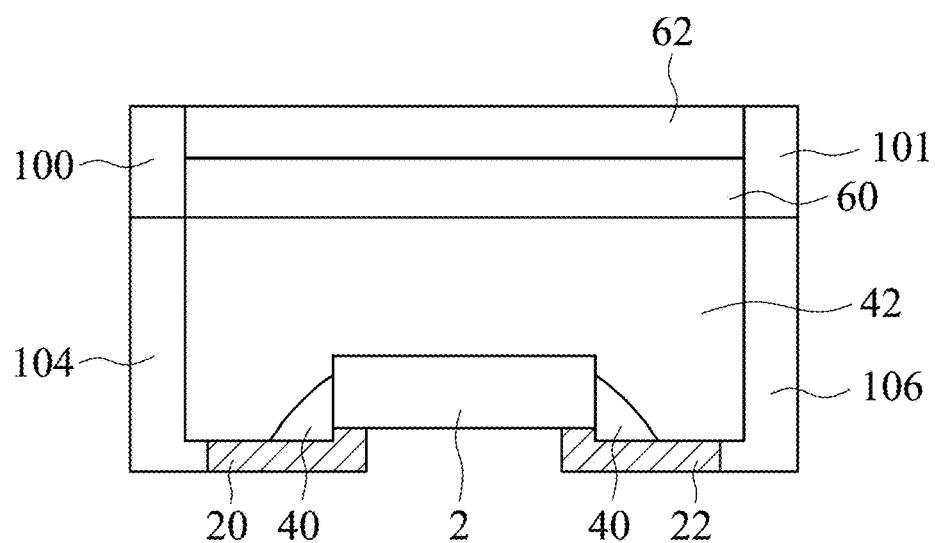

FIGS. 5A~5D show schematic views of light-emitting elements in accordance with embodiments of the present disclosure. Referring to FIG. 5A, the light-emitting element 3000 includes transparent top layers 80, 82, wavelength conversion layer 6, transparent bottom layers 40, 42, light-emitting unit 2 and protection layers 100, 101. The protection layers 100, 101 are formed on two sides of the wavelength conversion layer 6, and the protection layers 100, 101 are directly contacted with the wavelength conversion layer 6 and the second transparent bottom layer 42. In this embodiment, the protection layers 100, 101 are directly contacted with the transparent top layer 80. In another embodiment, a part of the wavelength conversion layer 6 is formed between the protection layers 100, 101 and the transparent top layer 80. Referring to FIG. 5B, the protection layers 100, 101 of the light-emitting element 4000 are formed on two sides of the wavelength conversion layer 6, and the protection layers 100, 101 are directly contacted with the wavelength conversion layer 6 and the second transparent bottom layer 42. The protection layers 100, 101 are not directly contacted with the transparent top layer 84 but extended into the second wavelength conversion layer 62 in a direction from the second transparent bottom layer 42 to the carrier 14. Referring to FIG. 5C, the protection layers 100, 101 of the light-emitting element 5000 cover the sidewall of the second transparent bottom layer 42, the sidewall of the wavelength conversion layers 60, 62, the sidewall of the transparent top layer 84 and the sidewall of the carrier 12. In an embodiment, the protection layers 100, 101 cover the sidewall of the carrier 12. The top surfaces of the protection layers 100, 101 are coplanar with the top surface of the carrier 12 away from the light-emitting unit 2. The top surface of the carrier 12 away from the light-emitting unit 2 is also the light-emitting surface of the light-emitting element 5000. In another embodiment, the top surfaces of the protection layers 100, 101 are not coplanar with the top surface (of the carrier 12), but located between the top surface and bottom surface (connecting to the transparent top layer 84). Or, the top surfaces of the protection layers 100, 101 are lower than the bottom surface of the carrier 12 and between the top surface and the bottom surface of the transparent top layer 84. Referring to FIG. 5D, the light-emitting element 6000 is similar with the light-emitting element 4000 in FIG. 5B, but the light-emitting element 6000 does not have a carrier 12. The insulating layers 104, 106 are connected to the sidewall of the second transparent bottom layer 42, and connected to the conduction layers 20, 22. The height of the interface between the protection layer 100 and the protection layer 104 and height of that between the protection layer 101 and the protection layer 106 can be the same or different. These interfaces can be flat or rough. Furthermore, the interface between the insulating layer 104 and the conduction layer 20 and that between the insulating layer 106 and the conduction layer 22 can be flat or rough.

The protection layers 100, 101 prevent the water, oxygen or particles from entering the wavelength conversion layer 6 and the second transparent bottom layer 42 so the reliability of the light-emitting element can be improved. The protection layers 100, 101 and the insulating layers 104, 106 can include transparent material, for example, at least 50% of the light from the light-emitting unit can pass the layers without being absorbed or blocked. The protection layers 100, 101 and the insulating layers 104, 106 can include reflective material to reflect light. For example, more than 70% of the light from the light-emitting unit 2 is concentrated on a direction being vertical with the top surface of the light-emitting unit 2. The widths of the protection layers 100, 101 can be non-uniform, which means the width can be narrowed or widened along a direction from the conduction layers 20, 22 to the carrier 12. The side surface, the top surface and the bottom surface (close to the surfaces of the conduction layers 20, 22) of the protection layers 100, 101 can be flat or rough surface(s).

Figure 6A:
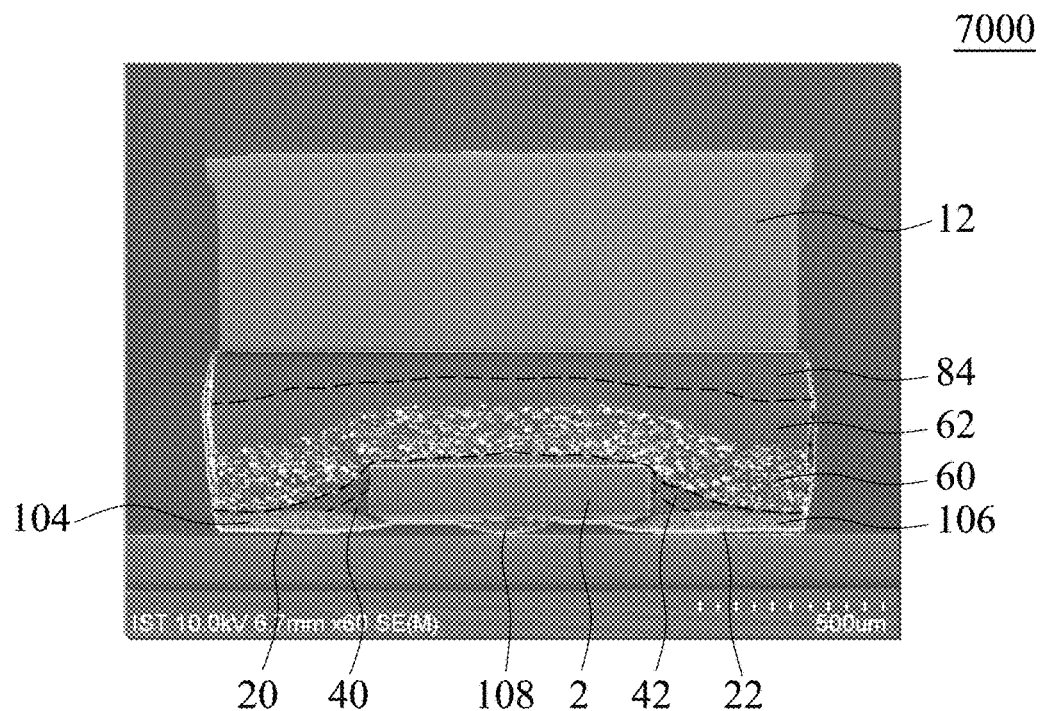
FIGS. 6A-6C show a schematic view of a light-emitting element in accordance with one embodiment of the present disclosure.
Figure 6B:
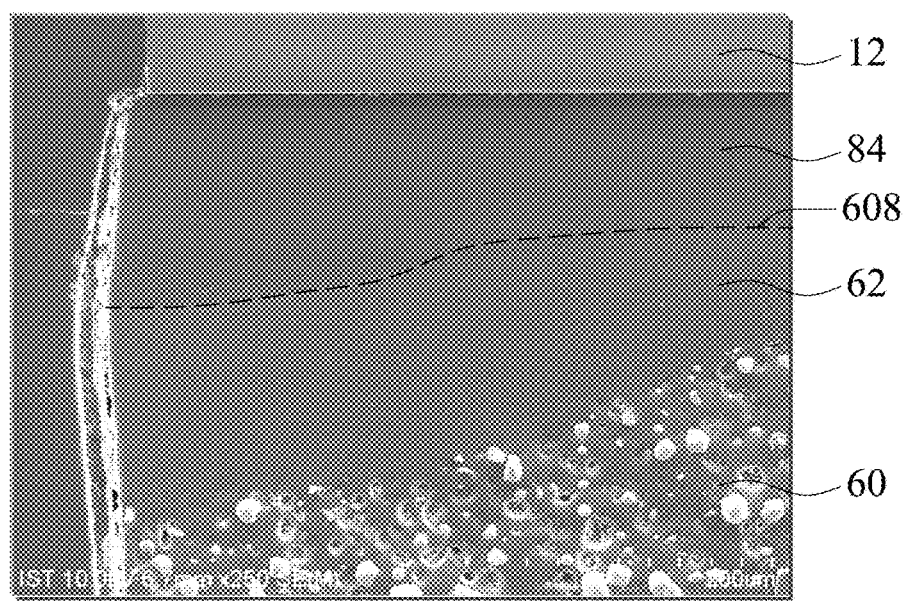
Figure 6C:
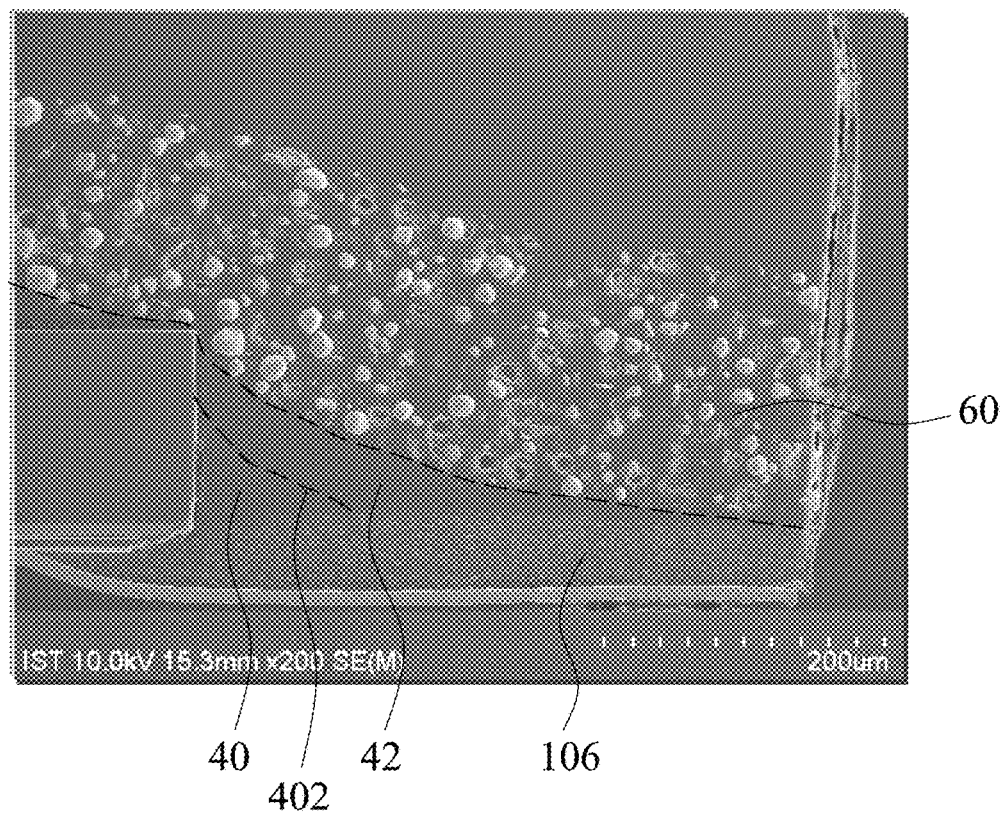

FIGS. 6A~6C show a schematic view of a light-emitting element in accordance with one embodiment of the present disclosure. Referring to FIG. 6A, the light-emitting element 7000 includes a light-emitting unit 2, conduction layers 20, 22, insulating layers 104, 106, 108, a first transparent bottom layer 40, a second transparent bottom layer 42, a first wavelength conversion layer 60, a second wavelength conversion layer 62, a transparent top layer 84, and a carrier 12. One side of the light-emitting unit 2 is connected to the conduction layers 20, 22, and the light-emitting unit 2 is electrically connected to external circuit through the conduction layers 20, 22. The insulating layers 104, 106 are formed on two sides of the light-emitting unit 2 and the insulating layer 108 is formed below the light-emitting unit 2 to isolate the conduction layers 20, 22. The insulating layers 104, 106, 108 can be reflective to reflect at least a part of the light from the light-emitting unit 2 to the carrier 12. The sidewall of the first wavelength conversion layer 60, the sidewall of the second wavelength conversion layer 62 and the sidewall of the transparent top layer 84 form an arc in a cross-sectional view. The arc is not coplanar with the sidewall of the carrier 12, but the arc and the sidewall are formed on the same surface in a 3D dimension.

Referring to FIG. 6B, the second wavelength conversion layer 62 and the transparent top layer 84 are sequentially formed between the carrier 12 and the first wavelength conversion layer 60. In an embodiment, the second wavelength conversion layer 62 and the transparent top layer 84 can include the same material, but an interface 608 is formed between the layers. Referring to FIG. 6C, the first transparent bottom layer 40 and the second the transparent bottom layer 42 are formed between the insulating layer 106 and the first wavelength conversion layer 60, and an interface 402 is formed between the two bottom layers.

Figure 7A:
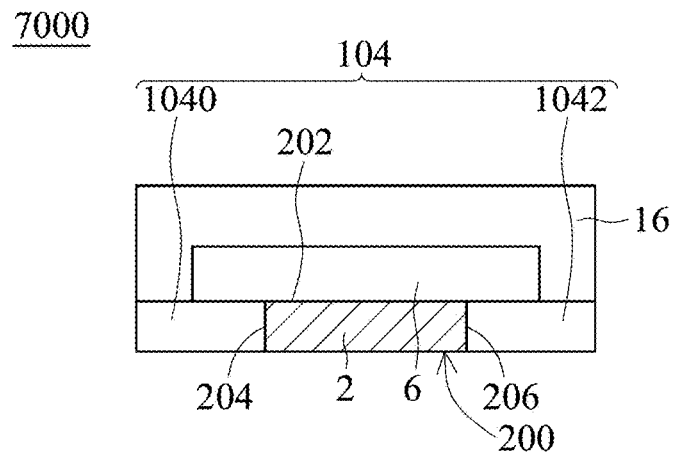
FIG. 7A shows a cross-sectional view of a light-emitting element in accordance with one embodiment of the present disclosure.

FIG. 7A shows a cross-sectional view (along the line x-x' in FIG. 7B) of a light-emitting element in accordance with one embodiment of the present disclosure. The light-emitting element 7000 in FIG. 7A includes a light-emitting unit 2, a first portion 1040 and a second portion 1042 of an insulating layer 104 (referring to FIG. 7B), a wavelength conversion layer 6, and a filter layer 16. The side surfaces 204, 206 of the light-emitting unit 2 are connected to the first portion 1040 and the second portion 1042. The wavelength conversion layer 6 covering the top surface 202 of the light-emitting unit 2 also covers part of the top surface of the first portion 1040 and the second portion 1042. Electrical pads (not shown) are formed on the bottom of the light-emitting unit 2 for electrical connection with an external circuit (not shown). The bottom surface of the wavelength conversion layer 6 is connected to the light-emitting unit 2, and the top surface and the side surface of the wavelength conversion layer 6 are covered by the filter layer 16. The bottom of the perimeter of the filter layer 16 is connected to the first portion 1040 and the second portion 1042. In an embodiment, the wavelength conversion layer 6 is directly contacted with to the light-emitting unit 2, the first portion 1040 and the second portion 1042. The top surfaces of the first portion 1040 and the second portion 1042 are substantially coplanar with the top surface 202 of the light-emitting unit 2, for example, the height difference is less than 5% of the total height of the light-emitting unit 2. In another embodiment, an adhesive layer (not shown) can be formed under the wavelength conversion layer 6 for providing the wavelength conversion layer 6 an improved bonding strength with the light-emitting unit 2, the first portion 1040, and the second portion 1042. The insulating layer 104 (having a first portion 1040 and a second portion 1042) can reflect and/or scatter the light from the side surfaces 204, 206, and direct the light toward the top surface 202. The insulating layer 104 (having a first portion 1040 and a second portion 1042) can also reflect and/or scatter the light from the wavelength conversion layer 6, and direct the light upward.

The wavelength conversion layer 6 includes a base and a wavelength conversion material. The material of the wavelength conversion material can be a phosphor or a quantum dot material. The phosphor can be YAG, TAG, silicate, vanadate, alkaline earth metal selenide, metal nitride, fluoride, alkaline earth metal sulphide, metal oxynitride or mixture of tungstates and molybdates. The quantum dot material can be selenides, sulfides, phosphides or tellurides. The material of the base can be a resin, such as epoxy resin or silicone resin or Polymethylmethacrylate (PMMA) resin. In an embodiment, the light from the light-emitting unit 2, such as a blue light or an ultraviolet light, is converted by a wavelength conversion material in the wavelength conversion layer 6, such as a green quantum dot material, red quantum dot material, blue quantum dot material, yellow-greenish phosphor, red phosphor or blue phosphor, to generate a red light, a green light, a blue light. The filter layer 16 is used to block or filter the light from the light-emitting unit and not converted by the wavelength conversion layer 6. For example, only a part of UVA light, UVB light, UVC light or blue light from the light-emitting unit 2 is converted by the wavelength conversion layer 6 to emit a red light, and the filter layer 16 is adopted to block or absorb the unconverted blue light. For example, only a portion of UVA light, UVB light, UVC light or blue light from the light-emitting unit 2 is converted by the wavelength conversion layer 6 to emit red light, and the remaining portion of the light not converted is absorbed or blocked by the filter layer 16. The filter layer 16 includes an absorber, for example, a yellow paint is included to absorb blue light or benzotriazole to absorb ultraviolet light.

A difference between the quantum dot material and the phosphor, is that, under the same excitation wavelength, the full width at half maximum (FWHM) of the excited light. FWHM of the excited light from the quantum dot material is narrower than that from the phosphor. The light having a narrower FWHM is less filtered by a color filter and preserves a larger portion of the light passing through the color filter. The availability of the light is therefore enhanced. In addition, the light from the quantum dot material usually has a narrower spectrum. Therefore, the quantum dot material can be used in a display or monitor to enhance illuminance of a single color and its purity, and also provide a high color gamut.

The quantum dot material can be composed of a core and a shell. The materials of the shell and the core can be different semiconductor materials. The material of the shell has higher energy barrier than that of the core which is able to decrease the amount of excessive electrons dissipating from the core while repeatedly emitting light. Therefore, the decline of brightness of the quantum dot material can be eliminated. Specifically, the combination of the core and the shell (in the form of core/shell) can be cadmium selenide/zinc sulphide, indium phosphide/zinc sulfide, lead selenide/lead sulphide, cadmium selenide/cadmium sulphide, cadmium telluride/cadmium sulfide or cadmium selenide/zinc sulphide.

Figure 7B:
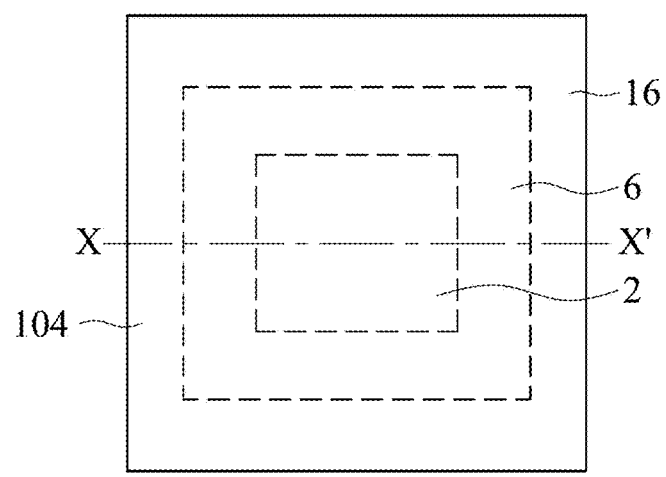
FIG. 7B shows a top view of a light-emitting element in FIG. 7A.

FIG. 7B shows a top view of a light-emitting element 7000 in FIG. 7A. The filter 16 covers the entire wavelength conversion layer 6, the entire light-emitting unit 2 and the insulating layer 104. The insulating layer 1040 surrounds the light-emitting unit 2. A part of the insulating layer 104 is formed right beneath the wavelength conversion layer 6.

Figure 7C:
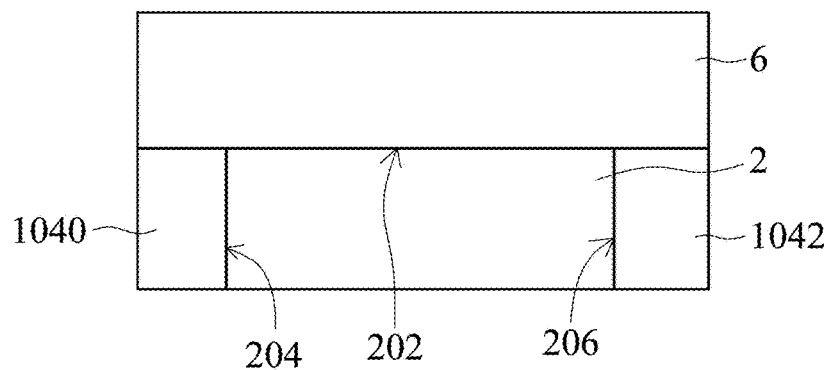
FIG. 7C shows a cross-sectional view of a light-emitting element in accordance with one embodiment of the present disclosure.

FIG. 7C shows a cross-sectional view of a light-emitting element in accordance with one embodiment of the present disclosure. The light-emitting element 7002 in FIG. 7C includes a light-emitting unit 2, an insulating layer 104 having a first portion 1040 and a second portion, and a wavelength conversion layer 6. The descriptions of the elements with the same reference numerals in the light-emitting element 7002 and the light-emitting element 7000 are omitted for brevity. The light-emitting unit 2 in the light-emitting element 7002 has a top surface 202, a bottom surface 208 and side surfaces 204, 206. The wavelength conversion layer 6 covers the top surface 202 of the light-emitting unit 2, the top surface of the first portion 1040, and the top surface of the second portion. As shown in the drawing, the outermost side surface of the wavelength conversion layer 6 is substantially coplanar with that of the insulating layer 104. To be more specific, the wavelength conversion layer 6 is substantially coplanar with an outermost side surface, which is away from the light-emitting unit 2, of the first portion 1040. Moreover, the wavelength conversion layer 6 is substantially coplanar with an outermost side surface, which is away from the light-emitting unit 2, of the second portion 1042.

Figure 7D:
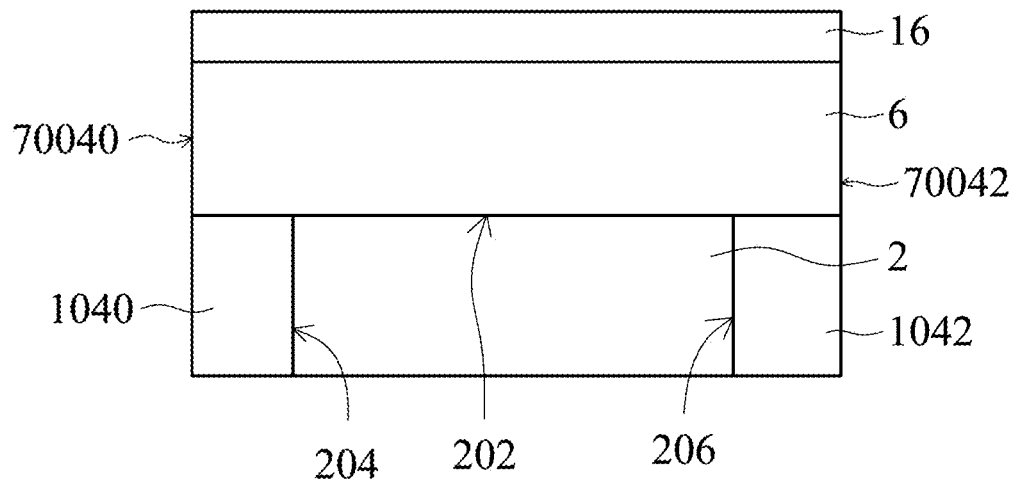
FIG. 7D shows a cross-sectional view of a light-emitting element in accordance with one embodiment of the present disclosure.

FIG. 7D shows a cross-sectional view of a light-emitting element in accordance with one embodiment of the present disclosure. The light-emitting element 7004 in FIG. 7C includes a light-emitting unit 2, an insulating layer 104 having a first portion 1040 and a second portion, a wavelength conversion layer 6 and a filter layer 16. The descriptions of the elements with the same reference numerals in the light-emitting element 7004 and the light-emitting element 7000 are omitted for brevity. As shown in FIG. 7D, the filter layer 16 and the wavelength conversion layer 6 both extend to the two outermost side surfaces of the insulating layer 104. In other words, the outermost side surfaces of the filter layer 16 and that of the wavelength conversion layer 6 are substantially coplanar with the outermost side surfaces of the light-emitting element 7004. The outermost side surfaces of the wavelength conversion layer 6 are labeled as 70040, 70042.

Compared with the light-emitting element 7000, the side surface of the wavelength conversion layer 6 is not covered by the filter layer 16. Therefore, more portions of the light generated by the light-emitting unit 2 within the light-emitting element 7004 are not blocked by the filter layer 16. For example, a blue light emitted by the light-emitting unit 2 of the light-emitting element 7004 has a peak wavelength or a dominant wavelength between 450~490 nm, and the blue light is absorbed by the wavelength conversion layer 6 to emit a red light having a peak wavelength or a dominant wavelength between 610~650 nm. A faint blue light may be observed near the outer perimeter of the wavelength conversion layer 6. The faint blue light usually comes from the light generated by the light-emitting unit 2 *e* which is not completely converted by the wavelength conversion layer 6 and not filtered by the filter layer 16. In another embodiment, shading layers (not shown) can be formed on the side surfaces 70040, 70042 to block or absorb the light (emitted from the light-emitting unit 2) not fully converted by the wavelength conversion layer 6. These shading layers can cover the side surfaces of the insulating layer 104, the wavelength conversion layer 6 and the filter layer 16; or merely cover the side surfaces of the wavelength conversion layer 6 and the filter layer 16; or merely cover the side surfaces of the wavelength conversion layer 6. In other words, the height of the shading layer can be less than or equal to a single layer in the light-emitting element 7004 or equal to the thickness of the light-emitting element 7004.

Figure 7E:
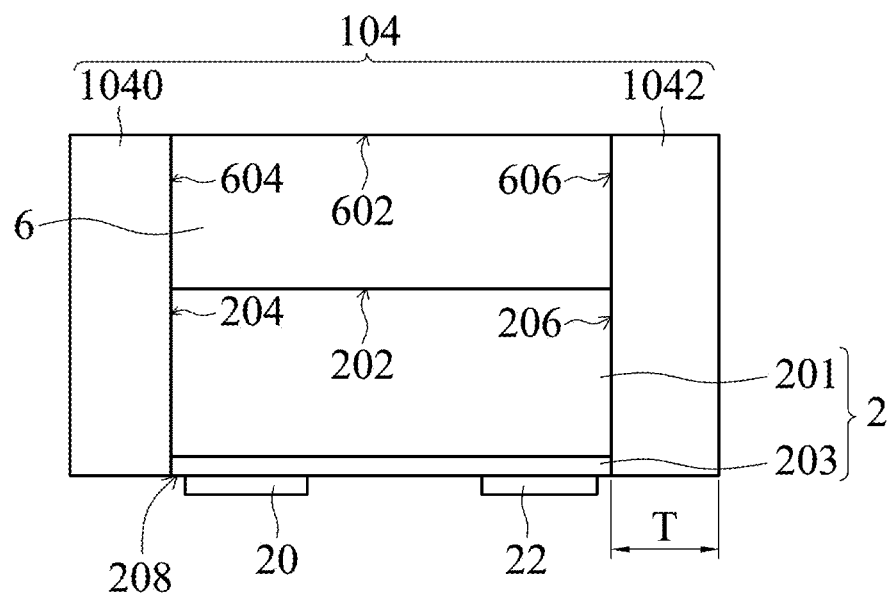
FIG. 7E shows a cross-sectional view of a light-emitting element in accordance with one embodiment of the present disclosure.

FIG. 7E shows a cross-sectional view of a light-emitting element 7006 in accordance with one embodiment of the present disclosure. The light-emitting element 7006 includes a light-emitting unit 2, an insulating layer 104, a wavelength conversion layer 6 and conduction layers 20 and 22. In one embodiment, the light-emitting unit 2 has a supporting substrate 201 and a light-emitting layer 203. The conduction layers 20, 22 electrically connect the light-emitting layer 203 in the light-emitting unit 2. Furthermore, the light-emitting unit 2 includes a top surface 202, a bottom surface 208, and a plurality of side surfaces 204 and 206 between the top surface 202 and the bottom surface 208. If the view on the light-emitting unit 2 is polygonal, there will be at least three faces, but only two faces are shown in the figure. The elements of same numbers in the light-emitting element 7006 or in the light-emitting element 7000 are omitted for brevity. In the light-emitting element 7006, the wavelength conversion layer 6 covers the top surface 202 of the light-emitting unit 2. In one embodiment, the width of the wavelength conversion layer 6 is substantially equal to that of the light-emitting unit 2. To be more specific, a side wall 604 of the wavelength conversion layer 6 is coplanar with the side surface 204 of the light-emitting unit 2, and a side wall 606 of the wavelength conversion layer 6 is coplanar with the side surface 206 of the light-emitting unit 2. In another embodiment, the width of the wavelength conversion layer 6 is greater than that of the light-emitting unit 2. For example, the width of the wavelength conversion layer 6 is greater than that of the light-emitting unit 2 by a range of 1 μm to 50 μm. The insulating layer 104 includes a first portion 1040 and a second portion 1042. As shown in the figure, the first portion 1040 extends from the side surface 204 to the side wall 604 of the wavelength conversion layer 6. Similarly, the second portion 1042 extends from the side surface 206 to the side wall 606 of the wavelength conversion layer 6. The height of the first portion 1040 can be similar with, the same as or different from that of the second portion 1042. The heights of the first portion 1040 and the second portion 1042 can be similar or the same while the insulating layer 104 has a uniform thickness. The heights of the first portion 1040 and the second portion 1042 can be same or different while the insulating layer 104 has a non-uniform thickness, such as a gradient thickness or having a bump. In one embodiment, the top surface 602 of the wavelength conversion layer 6 is coplanar with the upper surfaces of the first portion 1040 and the second portion 1042. In one embodiment, the thickness of the wavelength conversion layer 6 is ranged from 2 μm to 300 μm.

In one embodiment, the wavelength conversion layer 6 includes quantum dot material which is dispersed in the base material. In one embodiment, the weight percentage of the quantum dot material to the wavelength conversion layer 6 is ranged from 2% to 30%.

In one embodiment, the light-emitting unit 2 can emit a peak wavelength less than 425 nm, and the wavelength conversion layer 6 absorbs the light from the light-emitting unit 2 and converts to a light having a peak wavelength or a dominant wavelength not less than 425 nm. For example, a blue light has the dominant wavelength or peak wavelength ranged from 440 nm to 470 nm, a green light has the dominant wavelength or peak wavelength ranged from 500 nm to 550 nm or a red light has the dominant wavelength or peak wavelength ranged from 600 nm to 670 nm. The insulating layer 104 can reflect the light from the light-emitting unit 2 and/or the light from the wavelength conversion layer 6. In addition, the absorption rate of the insulating layer to the light from the light emitting unit 2 is greater than that of the light from the wavelength converting layer 6. Therefore, the insulating layer 104 can absorb a portion of the first light from the light-emitting unit 2 to avoid the leakage of the light from the light-emitting element 7006 (not converted by the wavelength conversion layer 6) in the lateral direction or in the central direction. In one embodiment, the ratio between the intensity of the light from the light-emitting unit 2 which is not converted by the wavelength conversion layer 6 and the light from the wavelength conversion layer 6 is less than 10%. In one embodiment, the insulating layer 104 includes resin and titanium oxide dispersed therein. The titanium oxide having the absorption rate of short wavelength is greater than that of long wavelength, especially for the wavelength less than 425 nm increasing obviously. In one embodiment, the weight percentage of the titanium oxide to the insulating layer 104 is not less than 60%. In another embodiment, the weight percentage of the titanium oxide to the insulating layer 104 is ranged from 20% to 60%. In an embodiment, the thickness T of the insulating layer 104 is ranged from 10 μm to 50 μm.

Figure 7F:
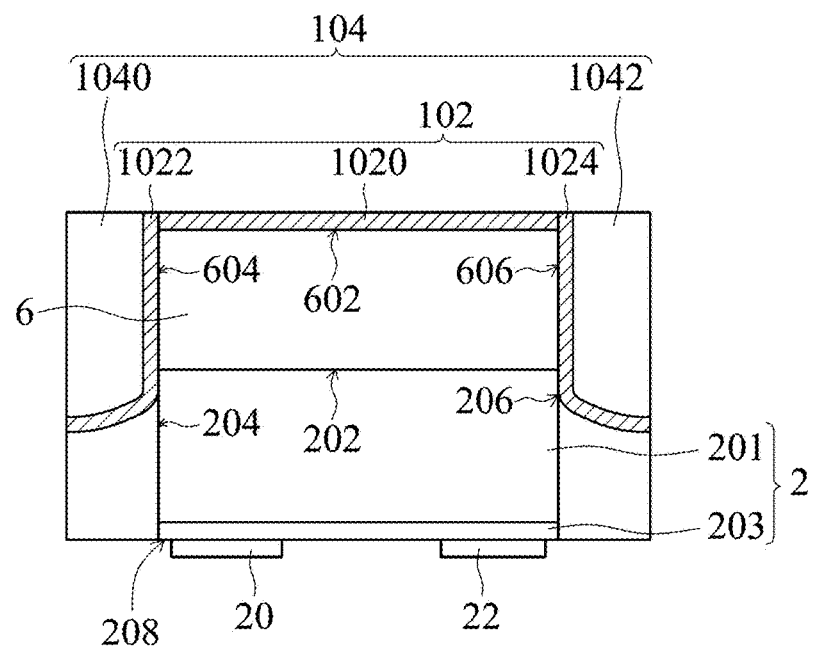
FIG. 7F shows a cross-sectional view of a light-emitting element in accordance with one embodiment of the present disclosure.

FIG. 7F shows a cross-sectional view of a light-emitting element 7008 in accordance with one embodiment of the present disclosure. In FIG. 7F, the light-emitting element 7008 includes a light-emitting unit 2, a barrier layer 102, an insulating layer 104, a wavelength conversion layer 6 and conduction layers 20 and 22. In one embodiment, the light-emitting unit 2 has a supporting substrate 201 and a light-emitting layer 203. The descriptions of the elements with the same reference numerals in the light-emitting element 7008 and in the light-emitting element 7006 are omitted for brevity. In one embodiment, the barrier layer 102 covers a top surface 602 of the wavelength conversion layer 6 and the side walls 604 and 606 thereof. As shown in FIG. 7F, the barrier layer 102 includes a first portion 1020, a second portion 1022 and a third portion 1024. The first portion 1020 covers the top surface 602 of the wavelength conversion layer 6 and the side walls 604 and 606. The second portion 1022 and the third portion 1024 respectively extend downwards along the side walls 604 and 606 to exceed the light-emitting unit 2 (or without exceeding the light-emitting unit 2), and bend towards left and right to pass through the insulating layer 104. In another embodiment, the barrier layer 102 can only cover the top surface 602 (not shown) of the wavelength conversion layer 6 or cover the top surface 602 (not shown) of the wavelength conversion layer 6 and the outside (not shown) of the side walls of the insulating layer 104. The barrier layer 102 can be used to prevent the quantum dot material or the phosphor material in the wavelength conversion layer 6 from being deteriorated by the moisture and the oxygen in the atmosphere. In one embodiment, the thickness of the barrier layer 102 is ranged from 1 μm to 150 μm.

In one embodiment, the barrier layer 102 includes a single-layer or multi-layer of oxide layer, nitride layer or the combination thereof, such as silica, alumina, silicon nitride or parylene to block the moisture and the oxygen in the atmosphere. In another embodiment, the barrier layer 102 further includes a carrier (not shown) to support the oxide layer.

Figure 7G:
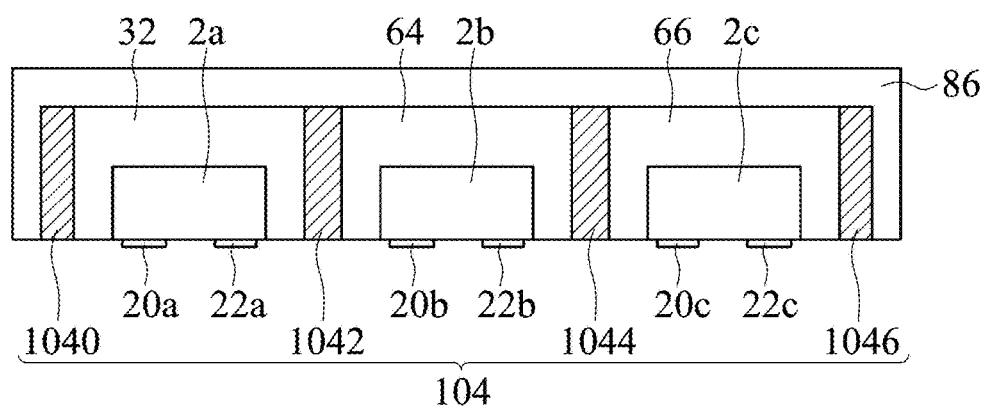
FIG. 7G shows a cross-sectional view of a light-emitting element in accordance with one embodiment of the present disclosure.

FIG. 7G shows a cross-sectional view of a light-emitting element 7010 in accordance with one embodiment of the present disclosure. The light-emitting 7010 includes a plurality of light-emitting units 2a, 2b and 2c, an insulating layer 104, a plurality of wavelength conversion layers 64 and 66, conduction layers 20a, 22a, 20b, 22b, 20c and 22c, a transparent cover layer 32 and a transparent layer 86. In an embodiment, the light-emitting element 7010 includes three light-emitting units 2a, 2b, and 2c, and each of them are surrounded by the insulating layer 104. In one embodiment, three light-emitting units 2a, 2b, and 2c are arranged in a row (in a top view), but not limited to, the light-emitting units can be also arranged in a triangle, a circle, and an L-shape (in a top view). The sequence of three light-emitting units 2a, 2b, and 2c also changes, such as 2b, 2a and 2c or 2a, 2c and 2b. Furthermore, as shown in FIG. 7G, the insulating layer 104 includes a first portion 1040, a second portion 1042, a third portion 1044 and a fourth portion 1046. In one embodiment, the first portion 1040 is located on the left side of the light-emitting unit 2a. The second portion 1042 is located between the first light-emitting unit 2a and the light-emitting unit 2b. The third portion 1044 is located between the light-emitting unit 2b and the light-emitting unit 2c. The fourth portion 1046 is located on the right side of the light-emitting unit 2c. In one embodiment, the peak wavelength emitted from the light-emitting unit 2a is different from the peak wavelengths emitted from the light-emitting unit 2b and the light-emitting unit 2c. For example, the peak wavelength emitted from the light-emitting unit 2a is greater than the peak wavelengths emitted from the light-emitting unit 2b and the light-emitting unit 2c. Or, the peak wavelength emitted from the light-emitting unit 2a is ranged from 440 nm to 470 nm, and the peak wavelengths emitted from the light-emitting unit 2b and the light-emitting unit 2c are both ranged from 390 nm to 420 nm (or in a spectrum of UVA). In another embodiment, the peak wavelength of the light emitted from the light-emitting unit 2a is larger than those from the second light-emitting unit 2b and the light-emitting unit 2c, and the peak wavelength of the light emitted from the light-emitting unit 2b is different from that from the light-emitting unit 2c, In another embodiment, the peak wavelength emitted from the first light-emitting unit 2a is the same as the peak wavelength emitted from the second light-emitting unit 2b and the third light-emitting unit 2c, such as the peak wavelength between 440 nm and 470 nm, or between 390 nm and 420 nm (or in a spectrum of UVA).

In one embodiment, the transparent cover layer 32 covers the light-emitting unit 2a, the wavelength conversion layer 64 covers the second light-emitting unit 2b, and the wavelength conversion layer 66 covers the light-emitting unit 2c. Light from the light-emitting unit 2a can emit directly outward through the transparent cover layer 32, or be reflected by the insulating layer 104 prior to emitting outward through the transparent cover layer 32. The transparent cover layer 32 filled between the first light-emitting unit 2a and the insulating layer 104 is beneficial to cause the light from the light-emitting unit 2a to emit outward through the lateral sides of the light-emitting unit 2a so as to increase the efficiency of light extraction. The wavelength conversion layer 64 covers the second light-emitting unit 2b. The wavelength conversion layer 66 covers the third light-emitting unit 2c. The wavelength conversion layer 64 and the second wavelength conversion layer 66 respectively convert the light from the light-emitting unit 2b and the light-emitting unit 2c to another light. In an embodiment, the peak wavelength of the light from the light-emitting unit 2a is between 440 nm and 470 nm, the light-emitting units 2b and 2c can emit lights with the same or similar peak wavelengths. The wavelength conversion layer 64 and 66 can generate a green light having a peak wavelength between 500 nm and 550 nm and a red light having a peak wavelength between 600 nm and 670 nm, respectively. In another embodiment, the light-emitting unit 2a can emit light having a peak wavelength between 440 nm and 470 nm, the light-emitting units 2b and 2c can emit lights having peak wavelengths between 390 nm and 420 nm (or in a spectrum of UVA). The wavelength conversion layer 64 and 66 can emit lights which have a green light having a peak wavelength between 500 nm and 550 nm and a red light having a peak wavelength between 600 nm and 670 nm, respectively.

In another embodiment, a wavelength conversion layer (not shown) providing a light having a short wavelength (compared with the light from the wavelength conversion layer 64 or 66) covers the light-emitting unit 2a. The peak wavelengths of the lights from the light-emitting units 2a, 2b, 2c are between 390 nm and 420 nm (or in a spectrum of UVA). The wavelength of the light provided by the wavelength conversion layer is between 440 nm and 470 nm. The peak wavelength of the green light from the wavelength conversion layer 64 is between 500 nm and 550 nm. The peak wavelength of the red light from the wavelength conversion layer 66 is between 600 nm and 670 nm.

In an embodiment, the transparent layer 86 of the light-emitting element 7010 covers the insulating layer 104, the transparent cover layer 32, the first wavelength conversion layer 64 and the second wavelength conversion layer 66. The transparent layer 86 can reduce the influence of the moisture and the oxygen in the atmosphere on the quantum dot material or the phosphor material in the wavelength conversion layer 64, 66. In addition, the lights from the light-emitting units 2a, 2b and 2c can pass through the transparent layer 86. In an embodiment, the transparency of the transparent layer 86 with respect to the light-emitting element 7010 is larger than 50%. The material of the transparent layer 86 can be epoxy resin.

Figure 8A:
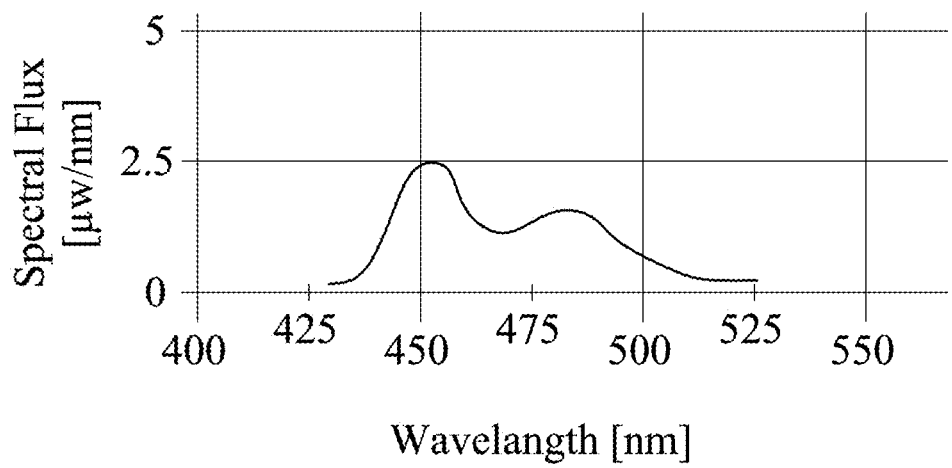
FIGS. 8A-8B show schematic views of optical properties of light-emitting elements shown in FIGS. 7A and 7C.
Figure 8B:
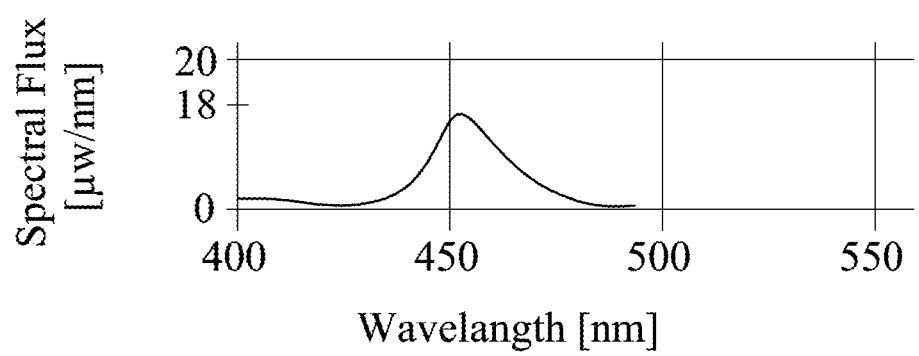
Figure 8C:
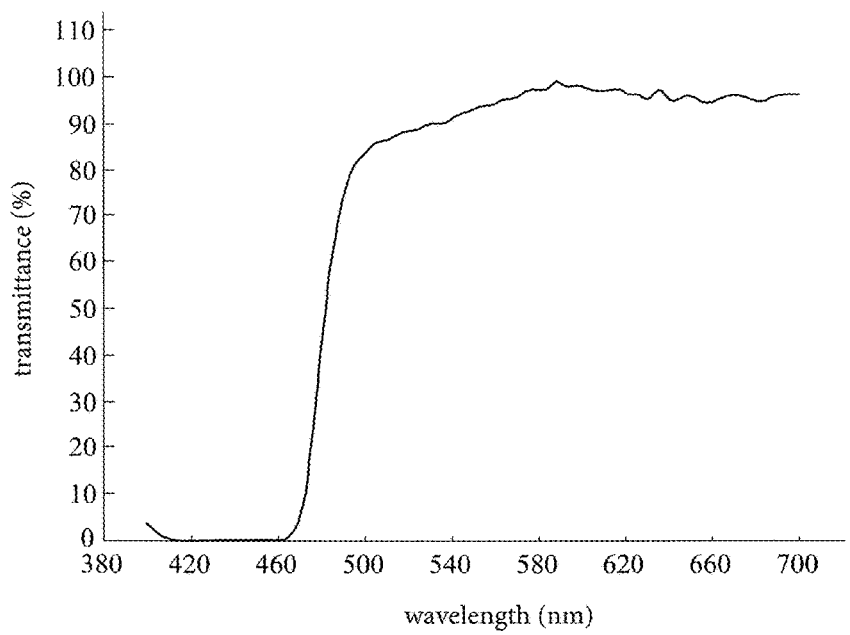
FIGS. 8C-8D show schematic views of optical properties of filter layers.
Figure 8D:
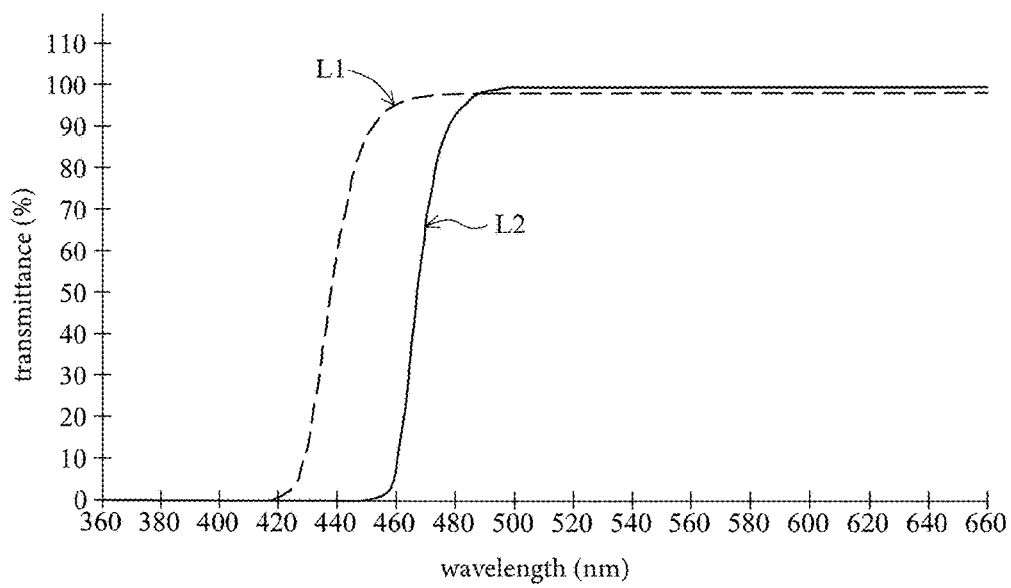

FIG. 8A shows the optical property of the light-emitting element 7000 in FIG. 7A, and FIG. 8B shows the optical property of the light-emitting element 7002 in FIG. 7C. In an embodiment, the result in FIGS. 8A and 8B are derived under the conditions below: the light-emitting element 7000 and the light-emitting element 7002 have lengths of about 1.4 mm, and widths of about 0.9 mm. In addition, the light-emitting units 2 in the light-emitting element 7000 and in the light-emitting element 7002 have lengths of about 0.3 mm, and widths of about 0.15 mm. The wavelength conversion layers 6 of the light-emitting element 7000 and the light-emitting element 7002 have thickness of about 0.2 mm. The wavelength conversion layer 6 includes quantum dot material to emit red light. Moreover, the filter layer 16 in the light-emitting element 7000 has a thickness of about 0.125 mm. As shown in FIG. 8A, the light emitted from the light-emitting element 7000 has a wavelength between 425 nm~525 nm, a peak wavelength about 450 nm and a spectral flux about 2.5 μW/nm. As shown in FIG. 8B, the light emitted from the light-emitting element 7002 has a wavelength between 400 nm~490 nm, a peak wavelength about 455 nm and a spectral flux about 18 μW/nm. According to FIGS. 8A~8B, the portion of the light not converted by the wavelength conversion layer is blocked by the filter 16 form the light-emitting element 7000 and the spectral flux of the light emitted from the light-emitting element 7000 within a spectrum ranging between 450 nm~490 nm is decreased, and the spectral flux is decreased from 18 μW/nm to 2.5 μW/nm compared with the light emitted from the light-emitting element 7002. In addition, the positions (of the light) on the CIE 1931 x-y chromaticity space of the two light-emitting elements can be easily distinguished. The coordinate of the light from the light-emitting element 7000 locates on the right top of the position of the light from the light-emitting element 7002 because the light from the light-emitting element 7000 has less blue portion. In addition, the filter layer 16 can be used to absorb the light from the wavelength conversion layer 6 or absorb the light from the wavelength conversion layer 6 and the light-emitting unit 2. FIGS. 8C~8D show three schematic views of optical properties of filter layers. Referring to FIG. 8C, the transmittance of the filter layer 16 is almost 0% with respect to the light having a wavelength lower than 470 nm, and the transmittance of the filter layer 16 is larger than 80% with respect to the light having a wavelength higher than 470 nm. The filter layer 16 having the optical property in FIG. 8C can be combined to form a light-emitting element 7000, and the part of the light from the light-emitting element 7000 having a wavelength between 450~470 nm is blocked or absorbed. Referring to FIG. 8D, the curve L1 indicates a filter layer 16 having a transmittance close to 0% with respect to the light having a wavelength lower than 420 nm and a transmittance larger than 80% with respect to the light having a wavelength larger than 440 nm. The filter layer 16 having an optical property like the curve L1 in FIG. 8D can be combined to form a light-emitting element 7000, and the part of the light from the light-emitting element 7000 having a wavelength between 200~420 nm is blocked or absorbed. Referring to FIG. 8D, the curve L2 indicates a filter layer 16 having a transmittance close to 0% with respect to the light having a wavelength lower than 450 nm and a transmittance larger than 80% with respect to the light having a wavelength larger than 470 nm. The filter layer 16 having an optical property of about the curve L2 in FIG. 8D can be combined to form a light-emitting element 7000, and the part of the light from the light-emitting element 7000 having a wavelength lower than 450 nm is blocked or absorbed.

Figure 9A:
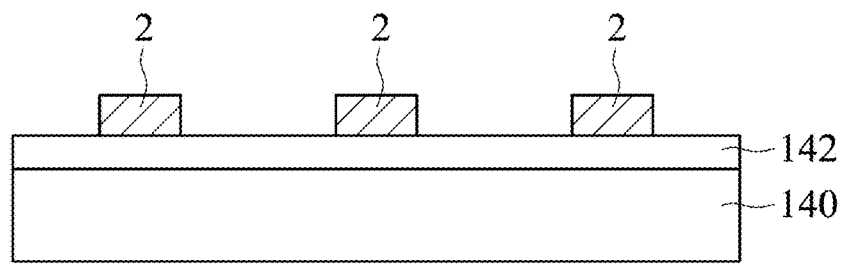
FIGS. 9A-9F show a manufacturing process of a light-emitting element shown in FIG. 7A.
Figure 9B:
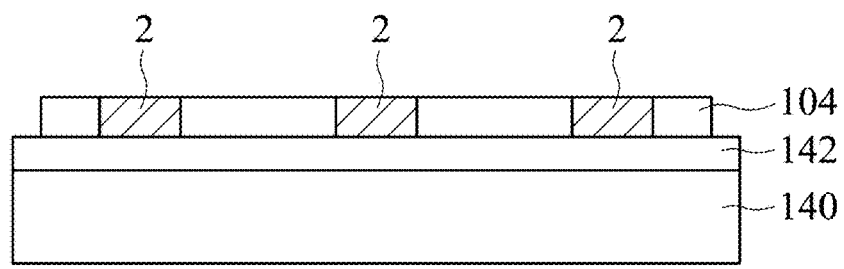
Figure 9C:
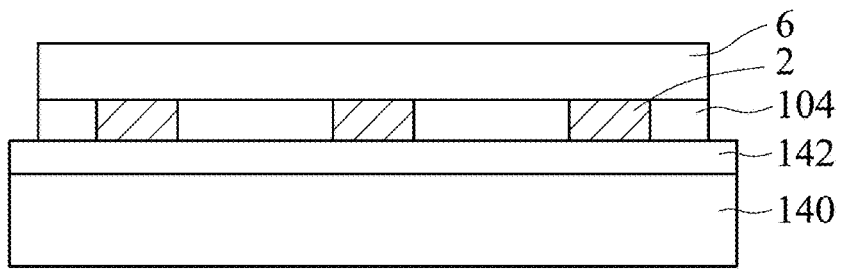
Figure 9D:
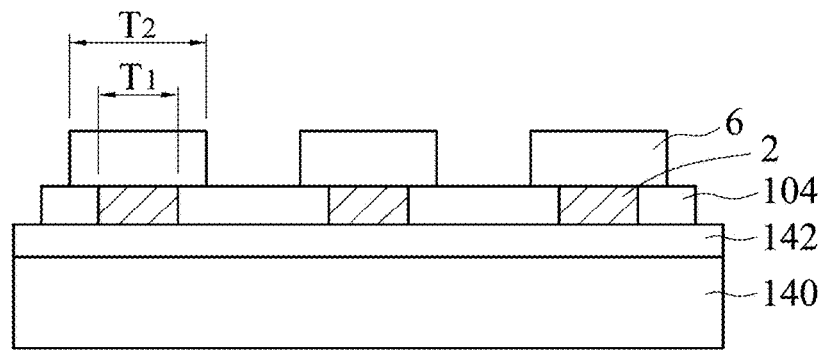
Figure 9E:
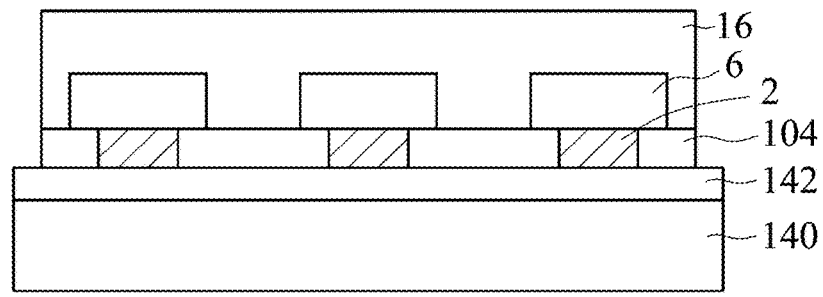
Figure 9F:
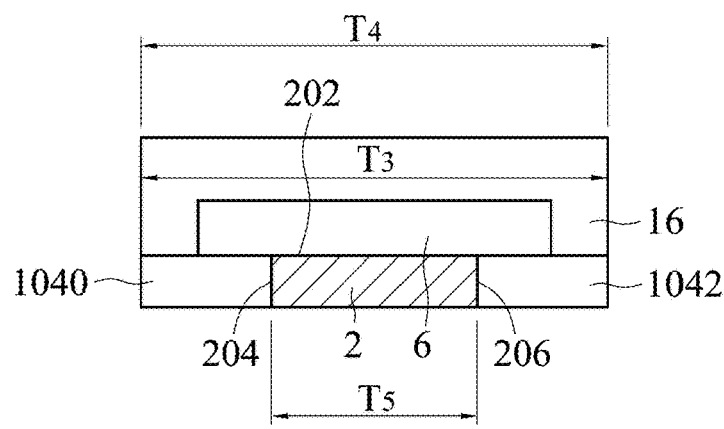
Figure 9G:
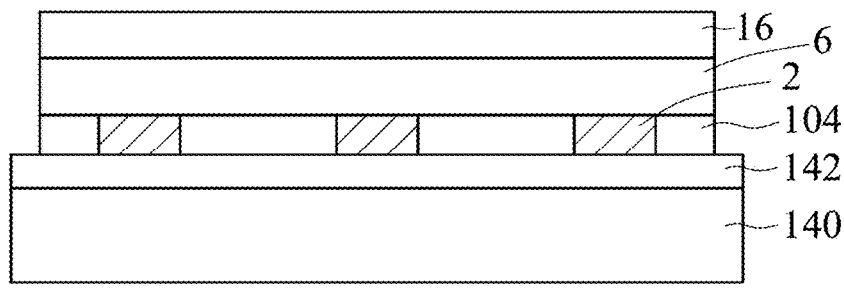

FIGS. 9A~9F show a manufacturing process of a light-emitting element in FIG. 7A. As shown in FIG. 9A, several light-emitting units are arranged (i.e. by adhesion) on the temporary carrier 140, and the light-emitting units 2 are arranged with an interval. An adhesive layer 142, such as a thermal release tape, can be optionally formed on the temporary carrier 140. The stickiness of the adhesive layer can be declined by heating, which is beneficial to the separation of the light-emitting unit 2 and the temporary carrier 140. Then, referring to FIG. 9B, an insulating layer 104 is arranged on the temporary carrier 140. The height of the insulating layer 104 is substantially the same with the thickness of the light-emitting unit 2. In other words, the top surface of the insulating layer 104 is substantially coplanar with that of the light-emitting unit 2. In one embodiment, an insulating material covers the surface of the plurality of light-emitting units 2, and then a portion of the insulating material is removed to form the insulating layer 104. The top surface of the insulating layer 104 can be made by mechanical grinding, wet deflash, or a combination thereof and is substantially coplanar with the top surface of the light-emitting unit 2. The wet deflash includes water jet deflash or wet blasting deflash. The water jet deflash removes the insulating material by the pressure of the liquid, such as water, or the nozzle jet. The wet blasting deflash has the powders added in the liquid and can removes the insulating layer by the combination of the pressure of the liquid and the impact of the powders. Referring to FIGS. 9C and 9D, the insulating layer 104 and the light-emitting units 2 are covered by the wavelength conversion layer 6. Then, a part of the wavelength conversion layer 6 is removed and the width of the wavelength conversion layer 6 is wider than the width of corresponding light-emitting unit 2. To be more specific, the width T1 of the light-emitting unit 2 is smaller than the width T2 of corresponding wavelength conversion layer 6 after removing a part of the wavelength conversion layer 6. In an embodiment, an adhesive layer (not shown in the figure) can be optionally arranged on the light-emitting unit 2 and/or the insulating layer 104 to attach the wavelength conversion layer 6 on the light-emitting unit 2 and/or the insulating layer 104. A filter layer 16 is arranged to cover the top surface and the side surface of the wavelength conversion layer 6. The filter layer 16 can be directly contacted with the insulating layer 104, as shown in FIG. 9E. The outermost surface of the filter layer 16 and the outermost surface of the wavelength conversion layer 6 are substantially coplanar with each other, but the outermost surfaces do not exceed the outermost surface of the temporary carrier 140. Referring to FIG. 9F, the portion of the filter layer 16, the portion of the wavelength conversion layer 6 and the portion of the insulating layer 104 (including a first portion 1040 and a second portion 1042) between the light-emitting units 2 are removed to expose the surface of the temporary carrier 140. Several light-emitting elements 7000 can be completed after removing the temporary carrier 140 as shown in FIG. 9F. Furthermore, the largest width T3 of the filter layer 16 is the same as or similar with the largest width T4 of the insulating layer 104, such as the difference of widths is less than 5% of the width T3 or the width T4. But the largest width T3 of the filter layer 16 is larger than the largest width T5 of the wavelength conversion layer 6.

Figure 9H:
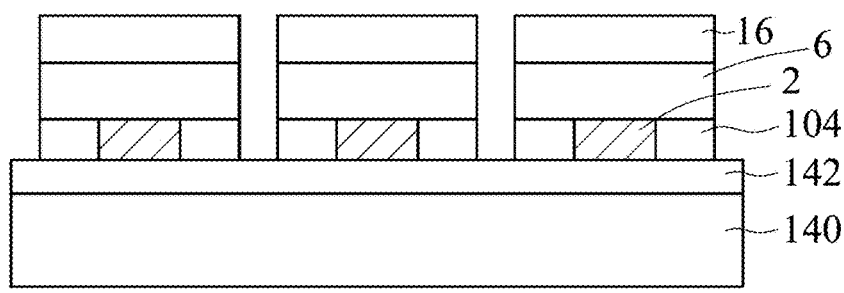
Figure 9I:
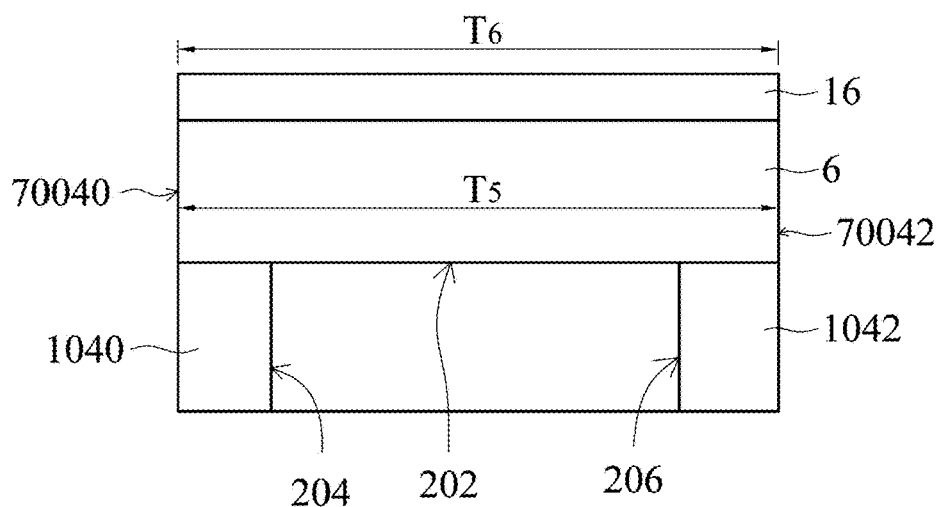

FIGS. 9A~9C, 9G~9H show a manufacturing process of a light-emitting element in FIG. 7D. Steps of process shown in FIGS. 9A~9C, are described above for reference and are omitted for brevity. Referring FIG. 9G, the wavelength conversion layer 6 and the filter layer 16 are sequentially formed after forming the insulating layer 104. The width of the wavelength conversion layer 6 is substantially the same with that of the filter layer 16, and the wavelength conversion layer 6 and filter layer 16 do not exceed the edge of the temporary carrier 140. Referring to FIG. 9H, the portion of the filter layer 16, the portion of the wavelength conversion layer 6 and the portion of the insulating layer 104 between the light-emitting units 2 are removed to expose the surface of the temporary carrier 140. Referring to FIG. 9I, the temporary carrier 140 is removed to form several light-emitting elements 7004. In addition, the largest width T6 of the filter layer 16 is equal to or similar with the largest width T5 of the wavelength conversion layer 6, such as the difference of widths is less than 5% of the width T5.

During the processes described above, the wavelength conversion layer 6 and/or the filter layer 16 can be used in a form of a film optionally formed on a light-emitting unit 2 by an adhesive layer (not shown in the figure) through an attaching step. The wavelength conversion layer 6 and the filter layer 16 can be applied in a form of a colloidal to be formed on a light-emitting unit 2 by spraying or dispensing. The adhesive layer can be a thermosetting resin, such as an epoxy resin or a silicone resin. The composition of the silicone resin can be adjusted according to physical requirement or optical requirement. For example, the silicone resin including aliphatic compound, such as Polymethylhydrosiloxane compound, has better ductility and malleability to resist the heat stress. Or, the silicone resin including aromatic compounds such as Polyphenylmethylsiloxane compound having a refractive index larger than that of the Polymethylhydrosiloxane compound to decrease the difference between the adhesive layer and the light-emitting unit 2 to improve light extraction efficiency. In an embodiment, the refractive index of the light-emitting unit 2 is between 1.75~2.60 with respect to a visible light, and that of the aromatic compounds is between 1.45~1.60. In addition to the function of insulation, the insulating layer 104 can reflect light from the light-emitting unit 2, and guides most of the light to pass the wavelength conversion layer 6. To be more specific, the insulating layer includes a base and several reflective particles (not shown in the figure) spread in the base. The base includes silicone-based material or epoxy-based material which has a refractive index between 1.4~1.6 or 1.5~1.6. The reflective particles can be titania, silica, alumina, zinc oxide, or zirconium dioxide. In an embodiment, the light from the light-emitting unit hits the insulating layer, and the light is reflected, wherein at least a part of the reflection belongs to diffusion reflection. The insulating layer 104 has a viscosity between 0.5~1000 Pa·s, such as 0.5, 2, 30, 100, 500 or 1000, and a hardness within a range (of shore D) which is between 40~90 after fully cured. Or, the insulating layer 104 has a viscosity between 100~10000 Pa·s, such as 500, 1000, 5000 or 10000 and a hardness within a range (of shore D) which is between 30~60 after fully cured.

FIGS. 10A~10F show a manufacturing process of a light-emitting element 7006 in FIG. 7E. The details of FIGS. 10A, 10B and 10C can be referred to paragraphs related to FIGS. 9A, 9B and 9C. The insulating layer 104' is a part of the entire insulating layer 104 (referring to FIG. 10F).

Figure 10A:
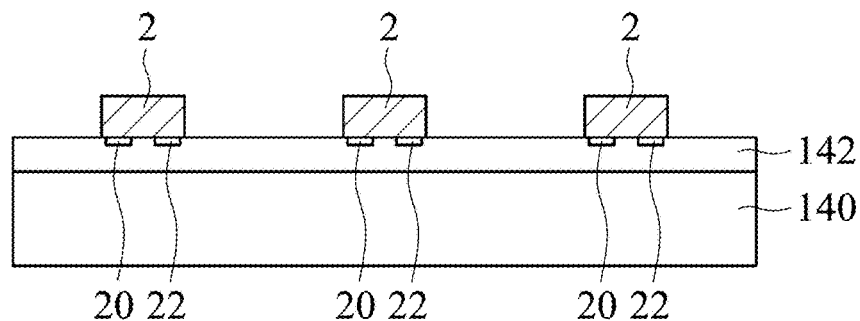
FIGS. 10A-10F show a manufacturing process of a light-emitting element in FIG. 7E.
Figure 10B:
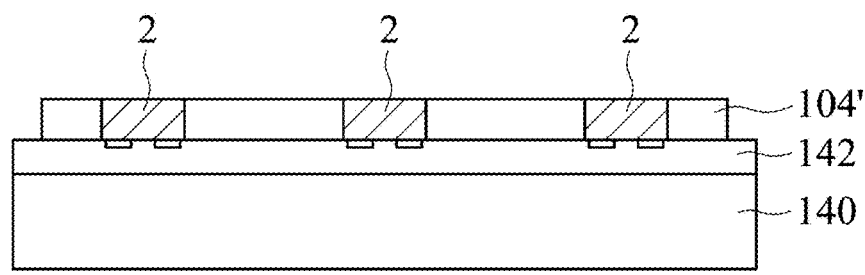
Figure 10C:
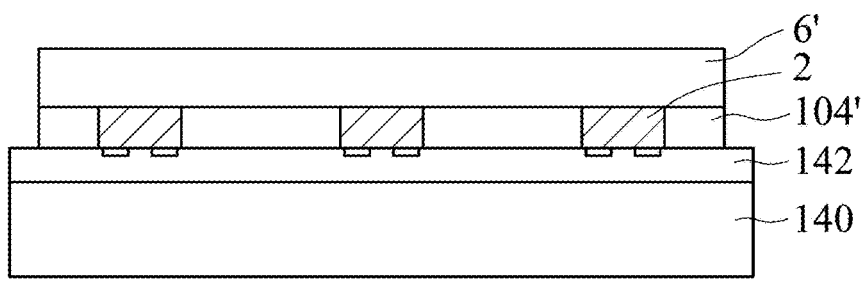
Figure 10D:
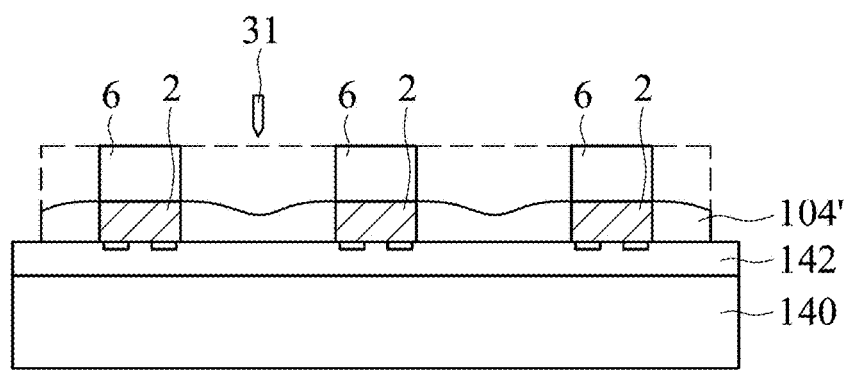
Figure 10E:
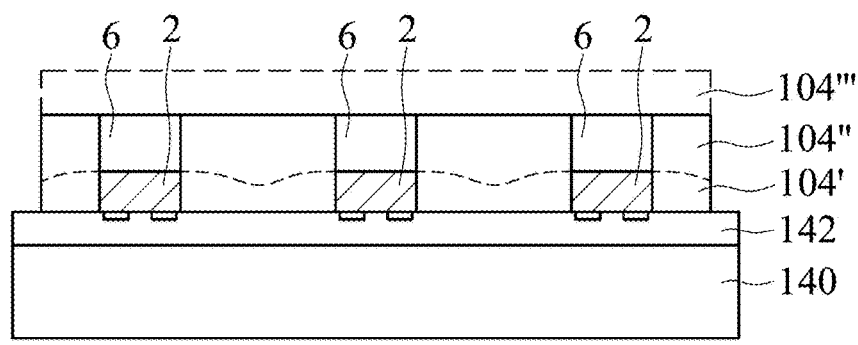
Figure 10F:
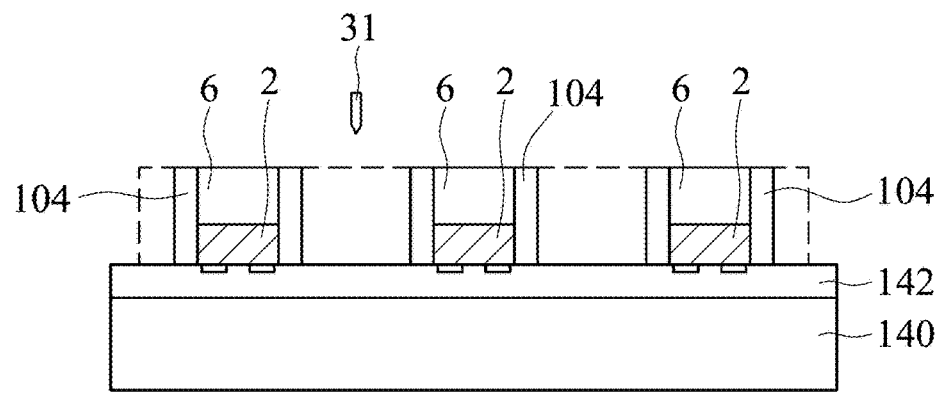

Referring to FIG. 10D, a wavelength conversion layer 6' is separated to form a plurality of wavelength conversion layers 6 and the width of each of the wavelength conversion layers 6 is substantially equal to that of a light-emitting unit 2. The light-emitting unit 2 and the wavelength conversion layers 6 at least have the same width at their connecting position. The separation includes cutting the wavelength conversion layer 6' by a cutting tool 31. In order to cutting through the wavelength conversion layer 6' by the cutting tool 31, the cutting tool 31 usually contacts the insulating layer 104' and is able to remove a portion of the insulating layer 104'. The cutting tool 31 usually has a curved tip, so a recessed portion is usually formed on the insulating layer 104' between the light-emitting units 2. Referring to FIG. 10E, the insulating layer 104" and the insulating layer 104''' cover the insulating layer 104' and the plurality of wavelength conversion layers 6. The insulating layer 104''' is removed to expose top surfaces of the wavelength conversion layers 6. The methods of removing the insulating material 104''' can be the same as or similar with those disclosed in FIG. 9B or FIG. 10B. In one embodiment, the insulating layer 104' and the insulating layer 104" can be cured at the same time after removing the insulating layer 104'''. In an embodiment, the material of the insulating layer 104' can be the same as or similar with that of the insulating layer 104" so the interface between the insulating layer 104' and the insulating layer 104" may not exist. Referring to FIG. 10F, the insulating layer 104' and the insulating layer 104" are separated to be the insulating layers 104 and forms a plurality of light-emitting elements 7006. Wherein the light-emitting element 7006 is fixed on the adhesive layer 142 and carrier 140. The method of separating insulating layers 104' and 104" includes cutting the insulating layer 104' and the insulating layer 104" by a cutting tool 31 to form a cutting path thereon.

Figure 10G:
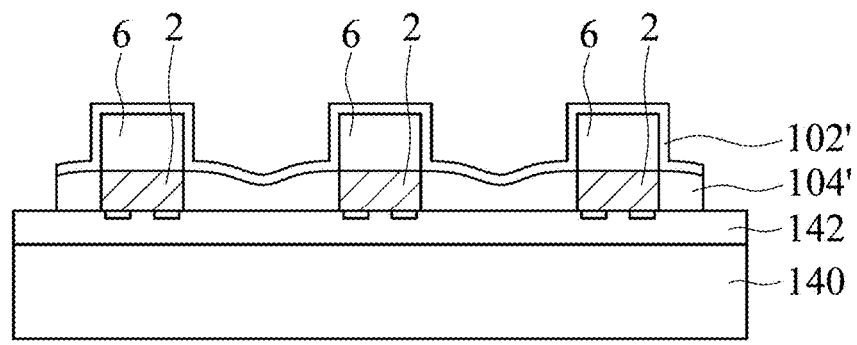
Figure 10H:
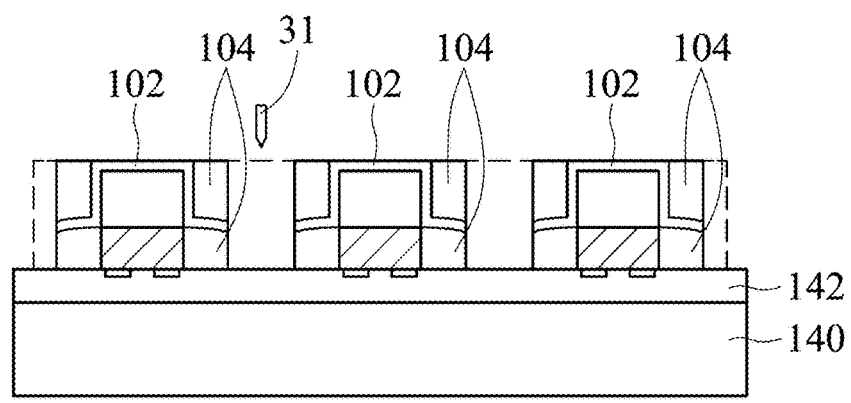

FIGS. 10A~10D and FIGS. 10G~10H show a manufacturing process of a light-emitting element 7008 in FIG. 7F. Referring to FIG. 10G, after finishing process in FIG. 10D, a barrier layer 102' covers the wavelength conversion layers 6 and the surface of the insulating layer 104'. The methods of forming the barrier layer 102' can be laminating or sputtering. Referring to FIG. 10H, the insulating layer 104', the insulating layer 104" and the barrier layer 102' are separated to be the insulating layer 104 and the barrier layer 102 and form a plurality of light-emitting elements 7008. The method of separating includes cutting the insulating layer 104' and the insulating layer 104" by a cutting tool 31 to form a cutting path thereon.

Figure 10I:
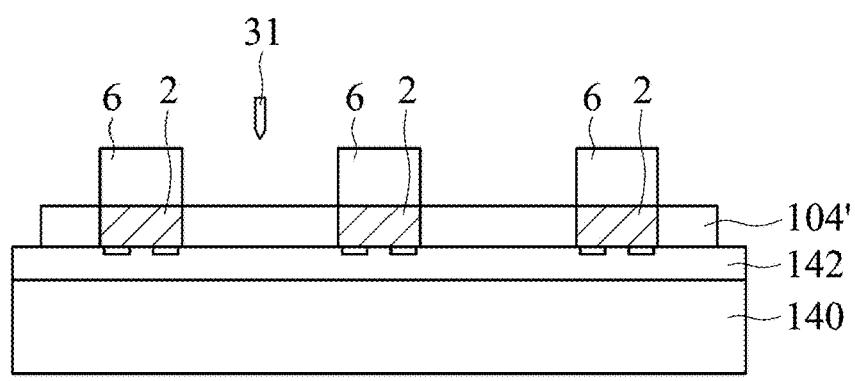
FIG. 10I shows another manufacturing process of a wavelength conversion layer.

In another embodiment, the wavelength conversion layer 6 can be formed by photolithography. If photolithography is applied, the step of FIG. 10C is followed by step of FIG. 10I, rather than the step of FIG. 10D. In order to apply a photolithography process, the wavelength conversion layer 6' includes a photosensitive resin which can be patterned by a photolithography. After the step of FIG. 10I, as described above, the steps of FIGS. 10E~10F or FIGS. 10G~10H can be applied to according to the structures of the light-emitting elements.

Figure 10J:
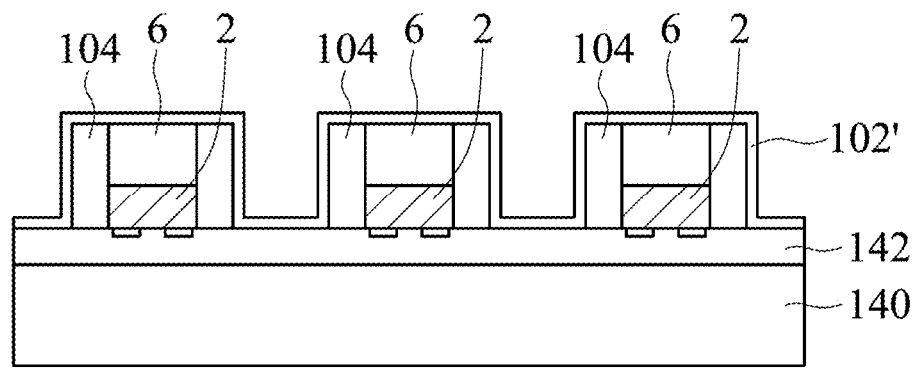
FIGS. 10J-10K show another manufacturing process of a barrier layer.
Figure 10K:
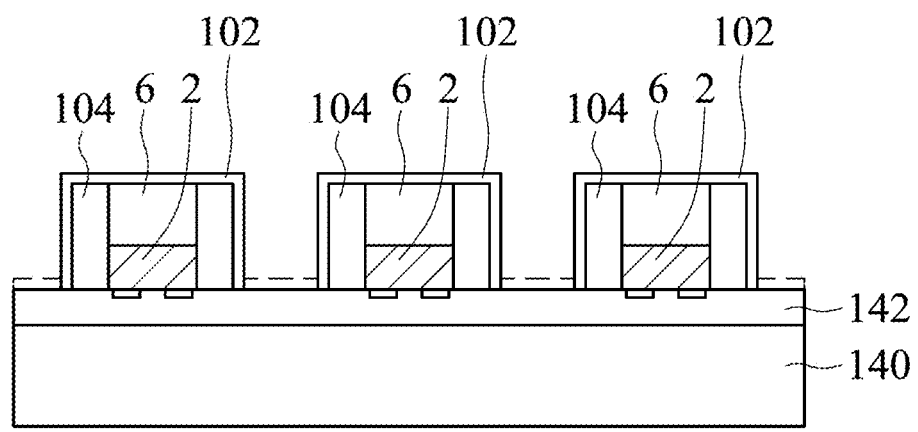

In another embodiment, the step of forming the barrier layer 102 can be performed after the steps shown in FIG. 10F. Referring to FIG. 10J, the barrier layer 102' covers the surfaces of the wavelength conversion layer 6 and the insulating layer 104. Referring to FIG. 10K, the barrier layer 102' is separated to be the barrier layer 102 and forms a plurality of independent light-emitting elements.

FIGS. 11A~11E show a manufacturing process of a light-emitting element 7010 in FIG. 7G. Referring to FIG. 9A, a plurality of the light-emitting units 2a, 2b and 2c are arranged on the temporary carrier 140 by adhering. Detailed manufacturing method can be referred to FIG. 9A and related paragraphs. Wherein the light-emitting units 2a, 2b and 2c can emit lights of the same wavelengths, such as the light-emitting units 2a, 2b and 2c all emit blue light or UV light; or emit lights of different wavelengths, such as the light-emitting units 2a, 2b and 2c respectively emit blue light, green light and red light; or some of the light-emitting units emit lights of the same wavelengths, such as the light-emitting units 2a emits a blue light while the light-emitting units 2b and 2c emit UV lights. The detailed descriptions can be referred to FIG. 7G and corresponding paragraphs.

Figure 11A:
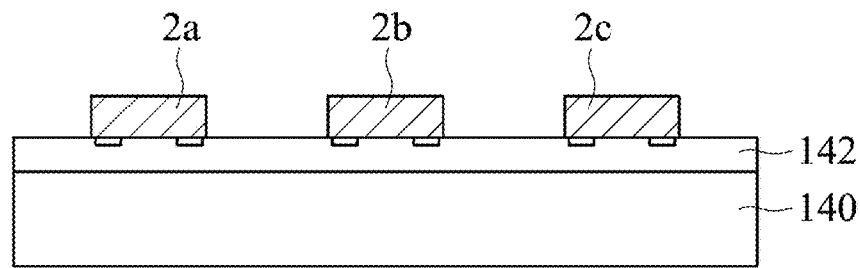
FIGS. 11A-11E show a manufacturing process of a light-emitting element in FIG. 7G.
Figure 11B:
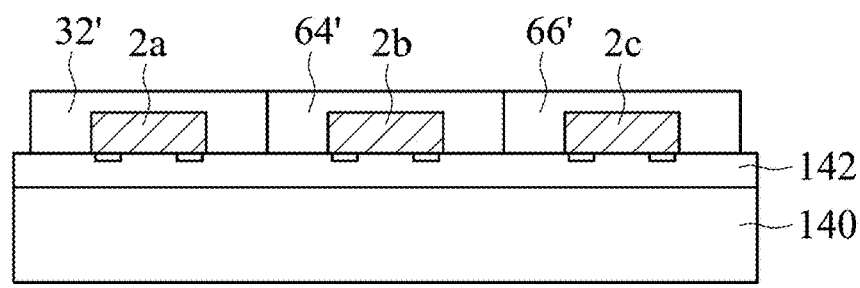

Referring to FIG. 11B, the transparent cover layer 32' covers the light-emitting unit 2a, the first wavelength conversion layer 64' covers the light-emitting unit 2b, and the second wavelength conversion layer 66' covers the light-emitting unit 2c. In one embodiment, the transparent cover layer 32' can be formed by applying the material of the transparent cover layer 32' in gel state to the corresponding positions by dispensing, and then the transparent cover layer 32' in gel state is cured to form the transparent covering layer 32'. The first wavelength conversion layer 64 and the second wavelength conversion layer 66 can be made by a method identical or similar to that of forming the transparent cover layer 32', with a replacement of the material placing on the light-emitting units 2b, 2c from the material of the transparent cover layer 32' to the material of the first wavelength conversion layer 64 and the material of the second wavelength conversion layer 66. In another embodiment, the transparent cover layer 32', the first wavelength conversion layer 64', and the second wavelength conversion layer 66' are formed on a film in advance. The transparent cover layer 32', the first wavelength conversion layer 64', and the second wavelength conversion layer 66' within the film are arranged according to the arrangement of the light-emitting units 2a, 2b, 2c. The film is laminated to the light-emitting units 2a, 2b and 2c and an adhering layer 142 and is cured. So, the transparent cover layer 32', the first wavelength conversion layer 64', and the second wavelength conversion layer 66' can be formed on the light-emitting units 2a, 2b and 2c at once. In addition to the transparent cover layer 32', the first wavelength conversion layer 64', and the second wavelength conversion layer 66', the material surrounding the transparent cover layer 32', the first wavelength conversion layer 64', and the second wavelength conversion layer 66' is also included in the sheet, such as black, white or other opaque material, like black pigment or white pigment.

Figure 11C:
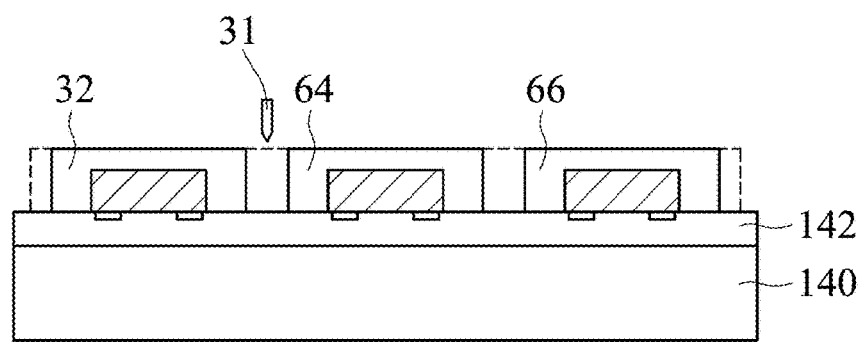
Figure 11D:
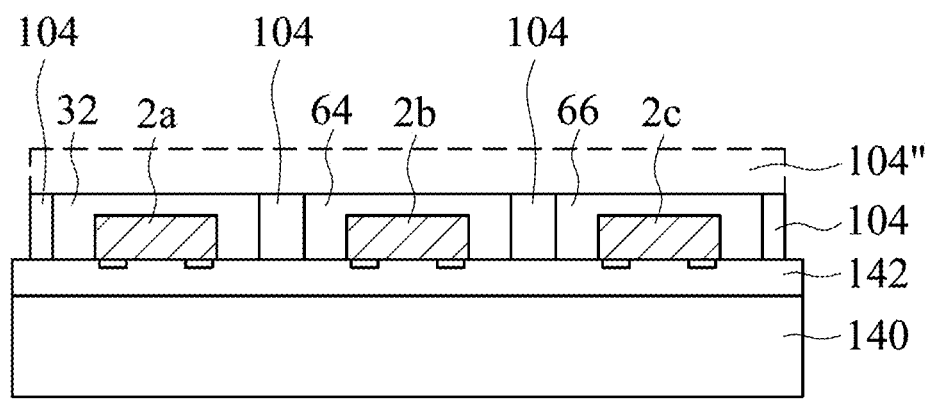
Figure 11E:
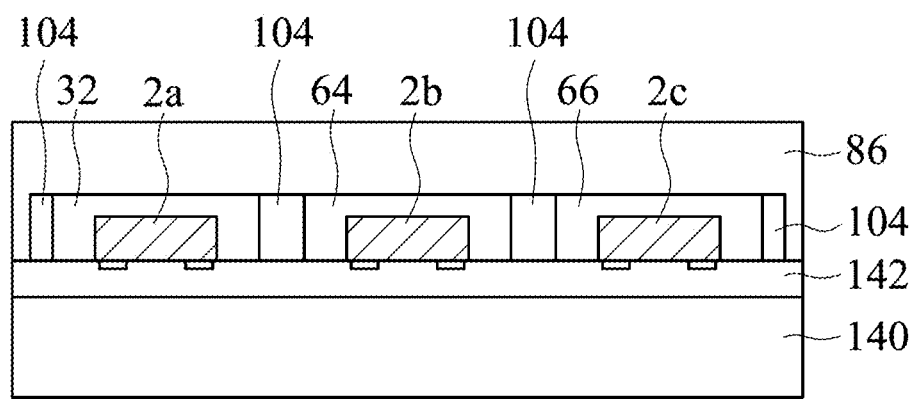

Referring to FIG. 11C, the transparent cover layer 32', the first wavelength conversion layer 64', and the second wavelength conversion layer 66' are separated to be the transparent cover layer 32, the first wavelength conversion layer 64, and the second wavelength conversion layer 66 and form a cutting path. Referring to FIG. 11D, the insulating layer 104 is formed between the transparent cover layer 32, the first wavelength conversion layer 64, and the second wavelength conversion layer 66. The method of forming the insulating layer 104 can be referred to the method disclosed in FIG. 10B and related paragraphs. The insulating layer 104 and the insulating layer 104' cover on the light-emitting unit, and the insulating layer 104' is removed. Referring to FIG. 11E, a translucent layer 86 is formed to cover the transparent cover layer 32, the first wavelength conversion layer 64, the second wavelength conversion layer 66 and the insulating layer 104 to form the light-emitting element 7010. Meanwhile, the light-emitting element 7010 is fixed on the temporary carrier 1405.

Figure 12A:
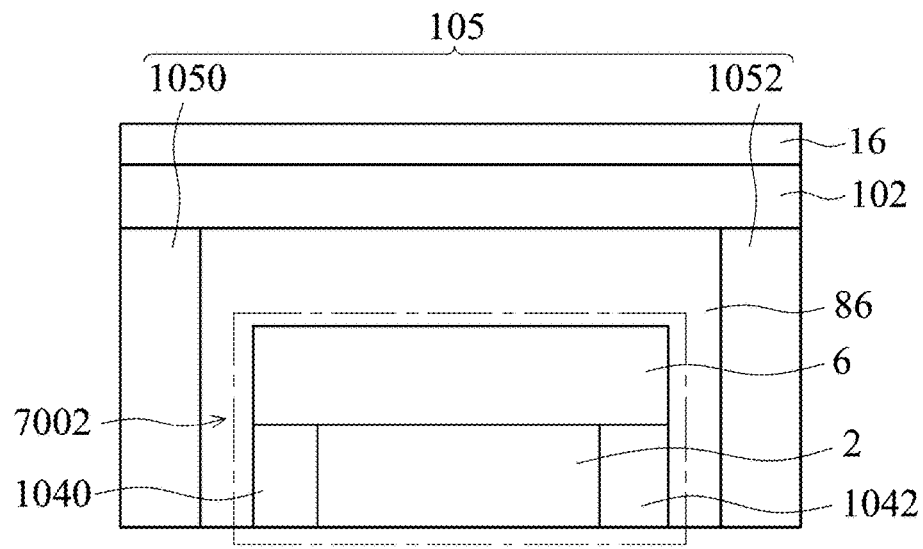
FIGS. 12A-12B show a schematic view of a light-emitting device in accordance with one embodiment of the present disclosure.

FIG. 12A shows a schematic view of a light-emitting device in accordance with one embodiment of the present disclosure. Referring to FIG. 12A, the light-emitting device 12001 includes a light-emitting element 7002, a barrier layer 102, light-absorbing layer 105, a transparent layer 86 and a filter layer 16. The light-emitting element 7002 is covered by the transparent layer 86. To be specific, the top surface and the side surface of the light-emitting element 7002 are directly contacted with to the transparent layer 86. Most of the light, such as more than 80% of the light, from the light-emitting element 7002 passes the transparent layer 8 without being blocked or absorbed. The side surface of the transparent layer 86 away from the light-emitting element 7002 is covered by the light-absorbing layer 105. As shown in the figure, the left side and the right side of the transparent layer 86 are respectively connected to a first portion 1050 and a second portion 1052 of the light-absorbing layer 105. Referring to FIG. 12A, the first portion 1050 and the second portion 1052 are separated from each other. In a top view (not shown), the first portion 1050 and the second portion 1052 can be two portions of one single structure or two substantially-separated components. The light-absorbing layer 105 can absorb light from the light-emitting element 7002 which includes the light from the light-emitting unit 2. The light-emitting device 12001 therefore emits less light towards the lateral side and the light-emitting device 12001 then generates more light moving upward (collimated light). The barrier layer 102 is arranged on the top of the light-emitting element 7002. To be specific, the barrier layer 102 is arranged above the light-absorbing layer 105 to be directly connected to the topmost surfaces of light-absorbing layer 105 and the transparent layer 86. The filter layer 16 is arranged on the barrier layer 102 to block light of specific color, such as blue light, UV light, red light, to filter unnecessary light or light which is harmful to human. More detailed description is described in the following embodiments. In addition, the largest width of the filter layer 16 and the barrier layer 102 are substantially the same (in a cross-sectional view or in a top view), and the outermost side surfaces of the filter layer 16 and the barrier layer 102 are substantially coplanar with the outermost side surface of the light-absorbing layer 105.

Figure 12B:
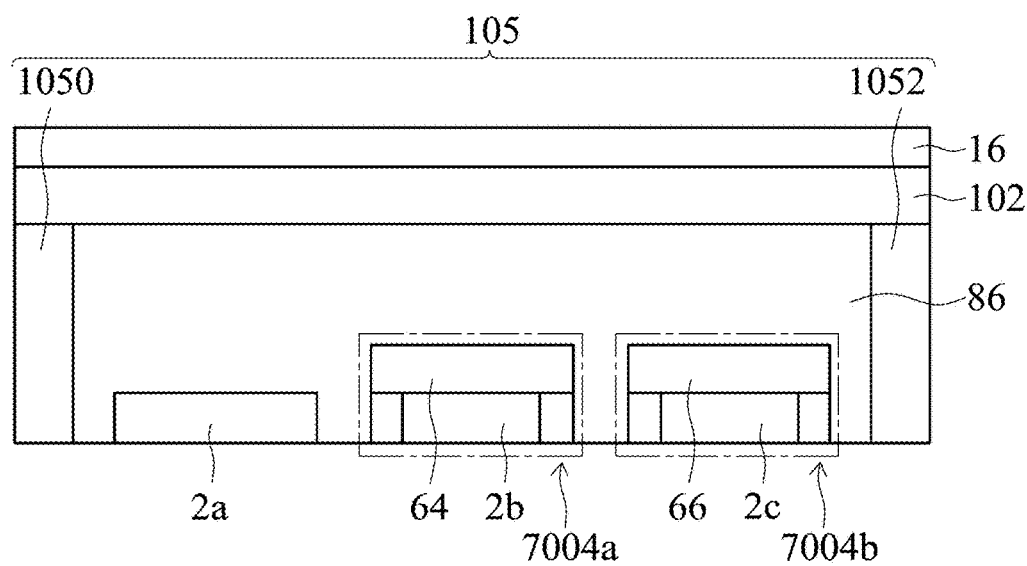

FIG. 12B shows a schematic view of a light-emitting device in accordance with one embodiment of the present disclosure. Referring to FIG. 12B, the light-emitting device 12002 includes a light-emitting element 7004a, a light-emitting element 7004b, light-emitting units 2a, 2b, 2c, a light-absorbing layer 105, a transparent layer 86 and a filter layer 16. The detailed description about the structure of the light-emitting device 12002 can be referred to the paragraphs related to the light-emitting device 12001 as shown above. It is noted, the color of light emitted from the light-emitting element 7004a can be different from the color of the light from the light-emitting element 7004b. To be more specific, the light-emitting device 12002 can be used as a pixel in a display, such as a monitor, a TV, or a billboard. The light-emitting unit 2a can emit a blue light, and the light-emitting elements 7004a, 7004b can respectively emit a red light and a green light. Furthermore, the light-emitting element 7004a has a light-emitting unit 2b and a wavelength conversion layer 64, and the light-emitting element 7004b has a light-emitting unit 2c and a wavelength conversion layer 66. The wavelength conversion layers 64, 66 emit different color lights after absorbing the blue light from the light-emitting unit 2. In an embodiment, the wavelength conversion layer 64 can be excited by a blue light to emit a red light, and the wavelength conversion layer 66 can be excited by a blue light to emit a green light. In an embodiment, the light-emitting units 2b, 2c in the light-emitting elements 7004a, 7004b emit invisible lights, and the wavelength conversion layers 64, 66 include a phosphor material or a quantum dot material absorbing the invisible lights to respectively emit a red light and a green light. While the light-emitting device 12002 is used as a pixel, the lights from neighboring pixels may interfere with each other. For example, when one pixel emit a blue light, and the color of the light from another pixel right next to the pixel may be influenced by mixing with the blue light. In one embodiment, a light-absorbing layer 105 is formed in the light-emitting device 12002 to absorb the light(s) emitting to the neighboring pixel(s). To be more specific, the light-absorbing layer 105 is arranged to surround the light-emitting device 1002 and absorbs the light emitting in a lateral direction to decline or avoid interference between neighboring pixels. Referring to FIG. 12B, the light-absorbing layer 105 is arranged on two sides of the light-emitting device 12002 as an example. The light-emitting device 12001 can be used as a sub-pixel, wherein three sub-pixels are included in one pixel. As shown in FIG. 12A, the light-absorbing layer 105 in the light-emitting device 12001 can be used to absorb the light from the light-emitting device 12001 in a lateral direction. The issue of crosstalk between neighboring light-emitting devices 12001 can be reduced or prevented.

Figure 13A:
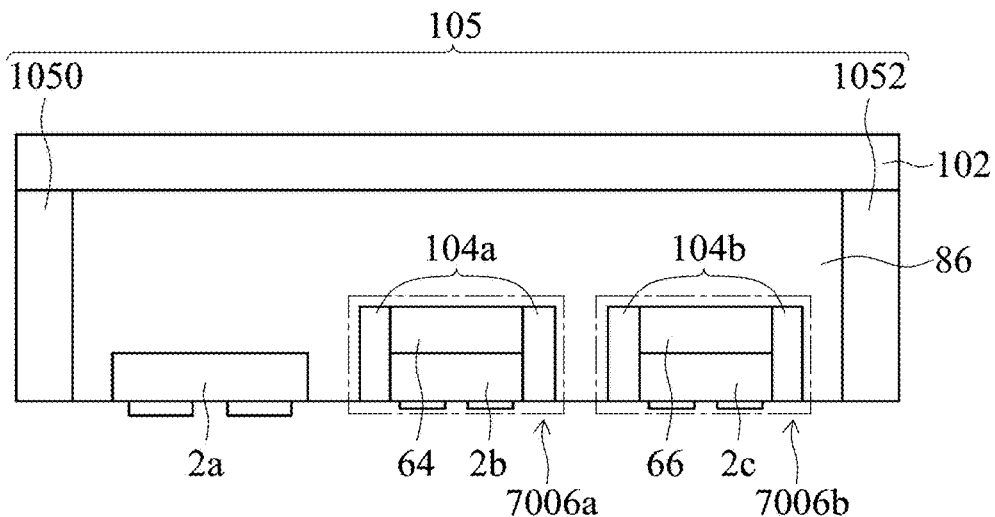
FIG. 13A shows a schematic view of a light-emitting device in accordance with one embodiment of the present disclosure.

FIG. 13A shows a schematic view of a light-emitting device 13001 in accordance with one embodiment of the present disclosure. Referring to FIG. 13A, the light-emitting device 13001 includes a light-emitting element 7006a, a light-emitting element 7006b, light-emitting units 2a, 2b, 2c, a barrier layer 102, a light-absorbing layer 105, and a transparent layer 86. The detail of the light-emitting device 13001 can be referred to related paragraphs about the light-emitting device 12002 as described above. It is noted that, the barrier layer 102 covers the top surfaces of the transparent layer 86 and the light-absorbing layer 105. Referring to FIG. 13A, the structures of the light-emitting element 7006a and the light-emitting element 7006b are similar to the structure disclosed in FIG. 7E. Because the insulating layers 104a, 104b of the light-emitting elements 7006a and 7006b surrounds the side walls of the wavelength conversion layers 64 and 66, the wavelength conversion layers 64 is prevented from being excited by the light from the light-emitting unit 2a or by the light from the light-emitting element 7006b, and the wavelength conversion layer 66 is prevented from being excited by the light from the light-emitting unit 2a or by the light from the light-emitting element 7006a. By applying the design shown above, it is possible to ensure that the light-emitting element emits a purer color light. Furthermore, the insulating layer can absorb the part of the light from the light-emitting units 2b and 2c which is not converted. The problem of light leakage of the light-emitting units 2b, 2c can be therefore eliminated.

Figure 13B:
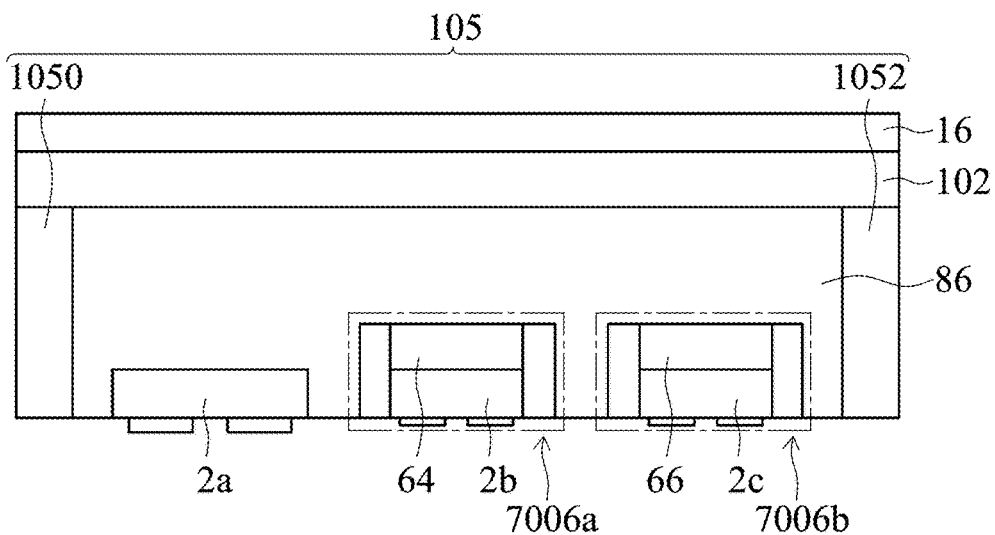
FIG. 13B shows a schematic view of a light-emitting device in accordance with one embodiment of the present disclosure.

FIG. 13B shows a schematic view of a light-emitting device 13002 in accordance with one embodiment of the present disclosure. Referring to FIG. 13B, to be compared with the light-emitting device 13001, the barrier layer 102 of the light-emitting device 13002 is covered by a light-absorbing layer 16. The lights from the light-emitting units 2b and 2c can be blocked or absorbed by the filter layer 16, and the light leakage of the light-emitting units 2b and 2c is prevented or reduced. For example, the UV light from the light-emitting units 2b and 2c which is not converted can be filtered by the filter layer 16 to avoid damage imposed on other components or the human eye.

Figure 14:
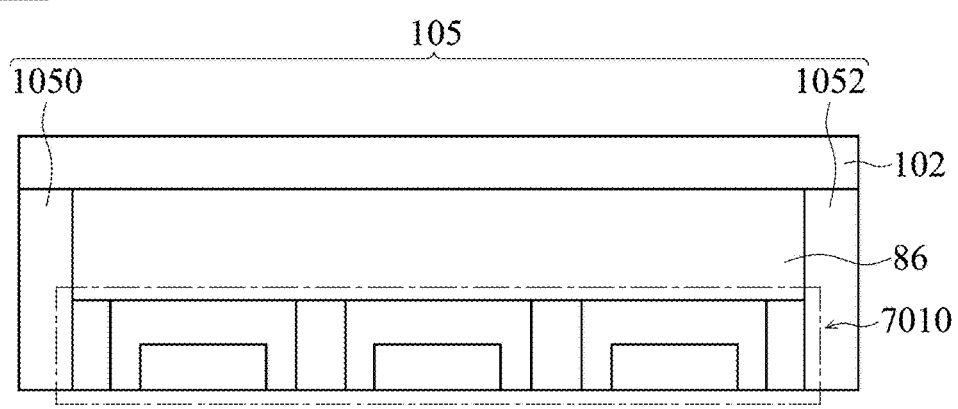
FIG. 14 shows a schematic view of a light-emitting device in accordance with one embodiment of the present disclosure.

FIG. 14 shows a schematic view of a light-emitting device 14001 in accordance with one embodiment of the present disclosure. The light-emitting device 14001 includes a light-emitting element 7010 (within the dashed lines), a barrier layer 102, and a transparent layer 86. The detail description about light-emitting device 14001 can be referred to relate paragraphs about light-emitting device 13001 shown above. The structure of the light-emitting element 7010 is similar to the structure shown in FIG. 7G.

Components in the light-emitting devices 12001, 12002, 13001, 13002, and 14001, such as the light-emitting element, the filter layer and the light-emitting unit can be referred to paragraphs in the present application.

The material of the transparent layer 86 of the light-emitting devices 12001, 12002, 13001, 13002, and 14001 can be thermosetting resin such as epoxy resin, silicone resin, phenolic resin, unsaturated polyester resin or polyimide resin. Similarly, proper material(s) can be adopted to form the transparent layer. For example, the transparent layer having a silicone resin including an aliphatic compound, such as Polymethylhydrosiloxane compound, has better ductility and malleability to resist the heat stress from the light-emitting element. Or, the transparent layer having a silicone resin including an aromatic compound, such as Polyphenylmethylsiloxane compound, has a higher refraction index.

The light-absorbing layer 105 can comprise Bismaleimide Triazine Resin (BT). The surface of the light-absorbing layer 105 can be coated with a material for absorbing visible light, such as a black ink, wherein the BT has a yellowish color.

The barrier layer 102 in the light-emitting device 12001, 12002, 13001, 13002 is a film with a proper ductility. To be more specific, the material of the film is Polyethylene Terephthalate (PET). An organic compound, an inorganic compound (e.g., oxide), or a stack of organic compound and oxide compound to block water and gas can be sprayed on the PET layer. In another embodiment, the barrier layer 102 is formed by deposition, such as atomic layer deposition (ALD) to form a thin film including alumina. The barrier layer 102 is able to block water and air, such as having a water vapor transmission rate (WVTR) 10~100 g/m$^2$ day or 10~100 cc/m$^2$ day.

The light-emitting device 12001, 12002, 13001, 13002, and 14001 includes one or more light-emitting elements, and the manufacturing method of the light-emitting element can be referred to related paragraphs and figures. Take the light-emitting device 12001 as an example, the light-emitting element 7002, is formed on a carrier to be electrically connected to the circuit on the carrier. Then, the light-absorbing layer 105 is formed to cover the periphery of the light-emitting element 7002. The light-absorbing layer 105 has a substantially-uniform thickness about 50 µm. The light-emitting element 7002 is arranged on the carrier by a bonding method. The bonding method is such as an application of metal bonding, solder, or anisotropic conductive paste (ACP). The anisotropic conductive paste (ACP) includes a glue having micro-solder ball or ultra-fine pitch fixed array ACP. The micro-solder ball is such as a self-assembly anisotropic conductive paste (SAP) of Sekisui Chemical. The ultra-fine pitch fixed array ACP can be obtained through product manufactured by Trillion Science Inc. In one embodiment, the conductive glue can be cured under 200° C. for about five minutes. The light-absorbing layer 105 can be cured under 200° C. for about twenty minutes. The transparent layer 86 is then formed among the light-absorbing layer 105 after forming the light-absorbing layer 105. The topmost surface of the transparent layer 86 is substantially coplanar with that of the light-absorbing layer 105. The barrier layer 102 and the filter layer 16 are sequentially formed on the transparent layer 86 and the light-absorbing layer 105. The transparent layer 86 can be cured under 70° C. for about 120 minutes. In another embodiment, the light-emitting device 12001 can be formed on a temporary carrier according to the process above, and the light-emitting device 12001 is then transferred to a carrier to be electrically connected to the circuit formed on the carrier.

The aforesaid semiconductor layer, light-emitting layer, protection layer, wire, electronic element, metal layer, electrode, fix portion, connection portion, extension portion, and electrical contact portion can be formed by a method of manufacturing a semiconductor layer, such as deposition and etching.

The foregoing description has been directed to the specific embodiments of this disclosure. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting element, comprising:
    a light-emitting unit, configured to emit a first light with a first peak wavelengths and comprising:
    a top surface;
    a bottom surface; and
    a first side surface and a second side surface, which are arranged between the top surface and the bottom surface;
    a wavelength conversion layer, configured to emit a second light with a second peak wavelength greater than the first peak wavelength, and covering the top surface, the wavelength conversion layer having a maximum width equal to that of the light-emitting unit, and a third side surface being coplanar with the first side surface;
    an insulating layer, having a first absorption rate in respect of the first light and a second absorption rate in respect of the second light, and connected to the first side surface, the second side surface, and the third side surface without overlapping the top surface; and
    a barrier layer directly connected to the wavelength conversion layer and the light-emitting unit,
    wherein the first absorption rate is greater than second absorption rate and the barrier layer has a curved portion.

2. The light-emitting element according to claim 1, wherein the wavelength conversion layer comprises a base material and a quantum dot material dispersed in the base material.

3. The light-emitting element according to claim 1, wherein the first peak wavelength is less than 425 nm.

4. The light-emitting element according to claim 1, wherein the insulating layer comprises a titanium oxide.

5. The light-emitting element according to claim 1, wherein the insulating layer comprises a thickness ranged from 10 µm to 50 µm.

6. The light-emitting element according to claim 1, further comprising a barrier layer covering the wavelength conversion layer.

7. The light-emitting element according to claim 6, wherein the barrier layer comprises oxide.

8. The light-emitting element according to claim 6, wherein the barrier layer comprising a portion passing through the insulation layer.

* * * * *